US012099088B2

(12) United States Patent
Hesselbarth et al.

(10) Patent No.: US 12,099,088 B2
(45) Date of Patent: Sep. 24, 2024

(54) TEST EQUIPMENT FOR TESTING A DEVICE UNDER TEST HAVING AN ANTENNA

(71) Applicant: Advantest Corporation, Tokyo (JP)

(72) Inventors: Jan Hesselbarth, Stuttgart (DE); José Moreira, Stuttgart (DE)

(73) Assignee: Advantest Corporation, Tokyo (JP)

( * ) Notice: Subject to any disclaimer, the term of this patent is extended or adjusted under 35 U.S.C. 154(b) by 102 days.

(21) Appl. No.: 17/683,104

(22) Filed: Feb. 28, 2022

(65) Prior Publication Data
US 2022/0308107 A1    Sep. 29, 2022

Related U.S. Application Data

(63) Continuation of application No. PCT/EP2019/073023, filed on Aug. 28, 2019.

(51) Int. Cl.
*G01R 31/302* (2006.01)
*G01R 1/04* (2006.01)
*G01R 31/28* (2006.01)
*G01R 31/303* (2006.01)
*H01L 21/66* (2006.01)

(52) U.S. Cl.
CPC ......... *G01R 31/3025* (2013.01); *G01R 1/045* (2013.01); *G01R 31/2822* (2013.01); *G01R 31/303* (2013.01); *H01L 22/14* (2013.01); *H01L 2924/00* (2013.01); *H01L 2924/0002* (2013.01)

(58) Field of Classification Search
CPC ............ G01R 31/3025; G01R 1/045; G01R 1/06733; G01R 31/01; G01R 31/2822; G01R 31/303; H01L 2924/00; H01L 2924/0002; H01L 22/14

USPC ..................................................... 324/754.31
See application file for complete search history.

(56) References Cited

U.S. PATENT DOCUMENTS

2006/0152232 A1   7/2006  Shvets et al.
2011/0267086 A1  11/2011  Pagani
2014/0370821 A1*  12/2014  Guterman ............. H04W 24/00
                                                         455/67.14
(Continued)

FOREIGN PATENT DOCUMENTS

EP    3483615 A1    5/2019

OTHER PUBLICATIONS

Chao-Fu Wang et al: "Electrically small magneto-dielectric coated VHF monopole antenna", Antennas and Propagation Society International Symposium (APSURSI), 2012 IEEE, IEEE, Jul. 8, 2012 (Jul. 8, 2012), pp. 1-2, XP032472393, DOI: 10.1109/APS.2012. 6349373 ISBN: 978-1-4673-0461-0 the whole document.
(Continued)

*Primary Examiner* — Raul J Rios Russo

(57) ABSTRACT

Devices for testing a DUT having a circuit coupled to an antenna are disclose. The device can include a DUT location for receiving a DUT, and an adapter or probe is used to wirelessly "over-the-air" (OTA) electronically test a DUT with an embedded antenna or antenna array with the measurement probe 140 located in close proximity to the DUT. The probe can be located very close to the DUT (e.g., in the near-field region). Although the probe is located in close proximity to the DUT antenna or antenna array elements it does not significantly disturb or interfere with probe during testing.

19 Claims, 29 Drawing Sheets

(56) References Cited

U.S. PATENT DOCUMENTS

| | | | |
|---|---|---|---|
| 2018/0003754 A1 | 1/2018 | Schrattenecker et al. | |
| 2018/0149674 A1* | 5/2018 | Bock et al. | |
| 2019/0036621 A1* | 1/2019 | Vanwiggeren | G01R 29/105 |
| 2019/0162767 A1* | 5/2019 | Wang | G01R 31/2822 |
| 2019/0353698 A1* | 11/2019 | DaSilva | H04B 17/17 |
| 2019/0356397 A1* | 11/2019 | DaSilva | H04B 17/17 |
| 2021/0265742 A1* | 8/2021 | Lee | G01R 29/10 |
| 2022/0182155 A1* | 6/2022 | Hesselbarth | G01R 31/3025 |

OTHER PUBLICATIONS

Ida I et al: "Dependence of the Efficiency-Bandwidth Product on Electrical Volume of Small Dielectric Loaded Antennas", IEEE Transactions on Antennas and Propagation, IEEE Service Center Piscataway, NJ, US, vol. 50, No. 6, Jun. 1, 2002 (Jun. 1, 2002), pp. 821-826, XP001123065, ISSN: 0018-926X, DOI: 10.1109/TAP. 2002.1017662 the whole document.

Takayuki Sasamori et al: "Wideband measurement for input impedance of balanced antenna using the S-parameter method", Antenna Technology and Applied Electromagnetics (ANTEM), 2012 15th International Symposium on, IEEE, Jun. 25, 2012 (Jun. 25, 2012), pp. 1-4, XP032219603, DOI: 10.1109/ANTEM.2012.6262314 ISBN: 978-1-4673-0290-6 the whole document.

* cited by examiner

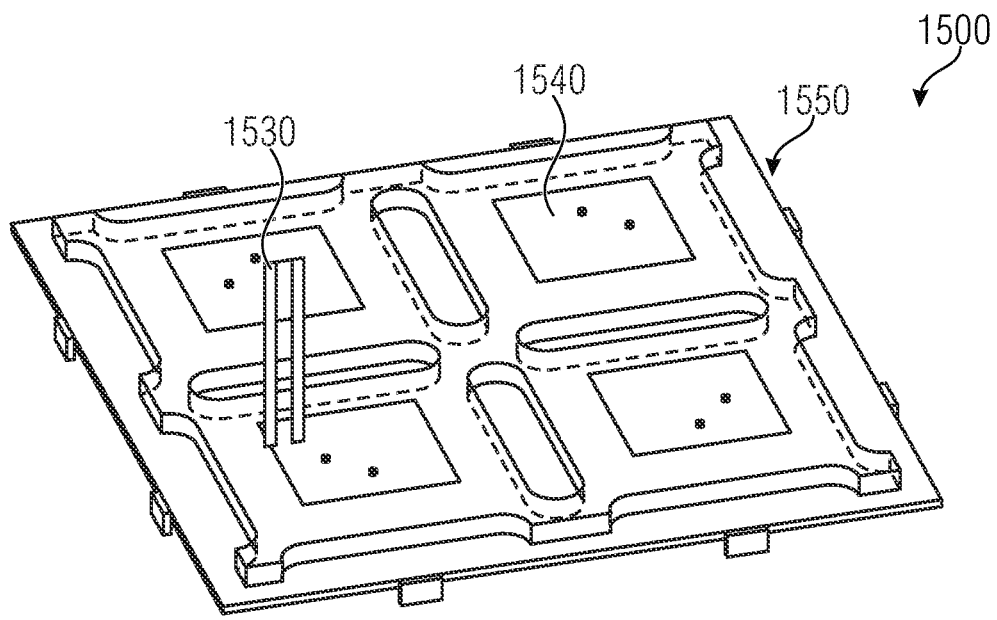
Fig. 15a
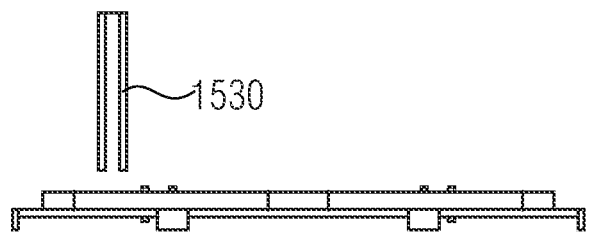
Fig. 15b
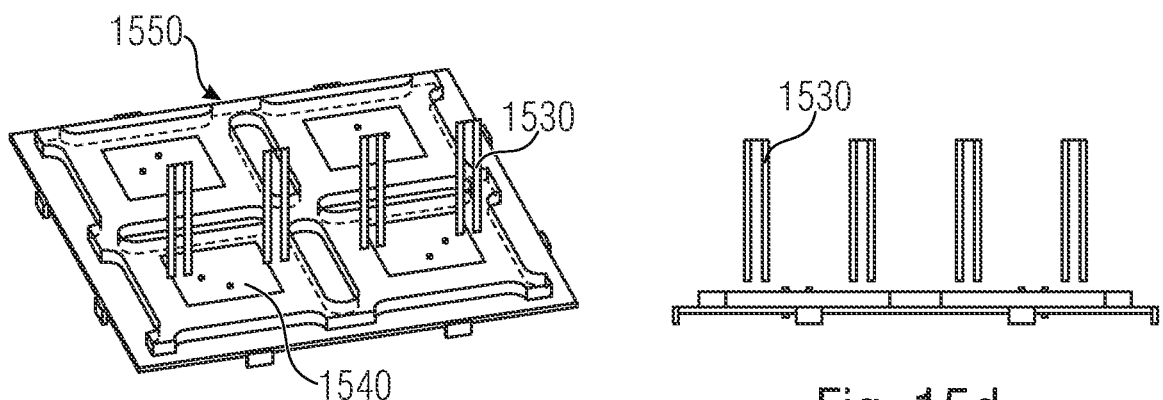
Fig. 15c
Fig. 15d

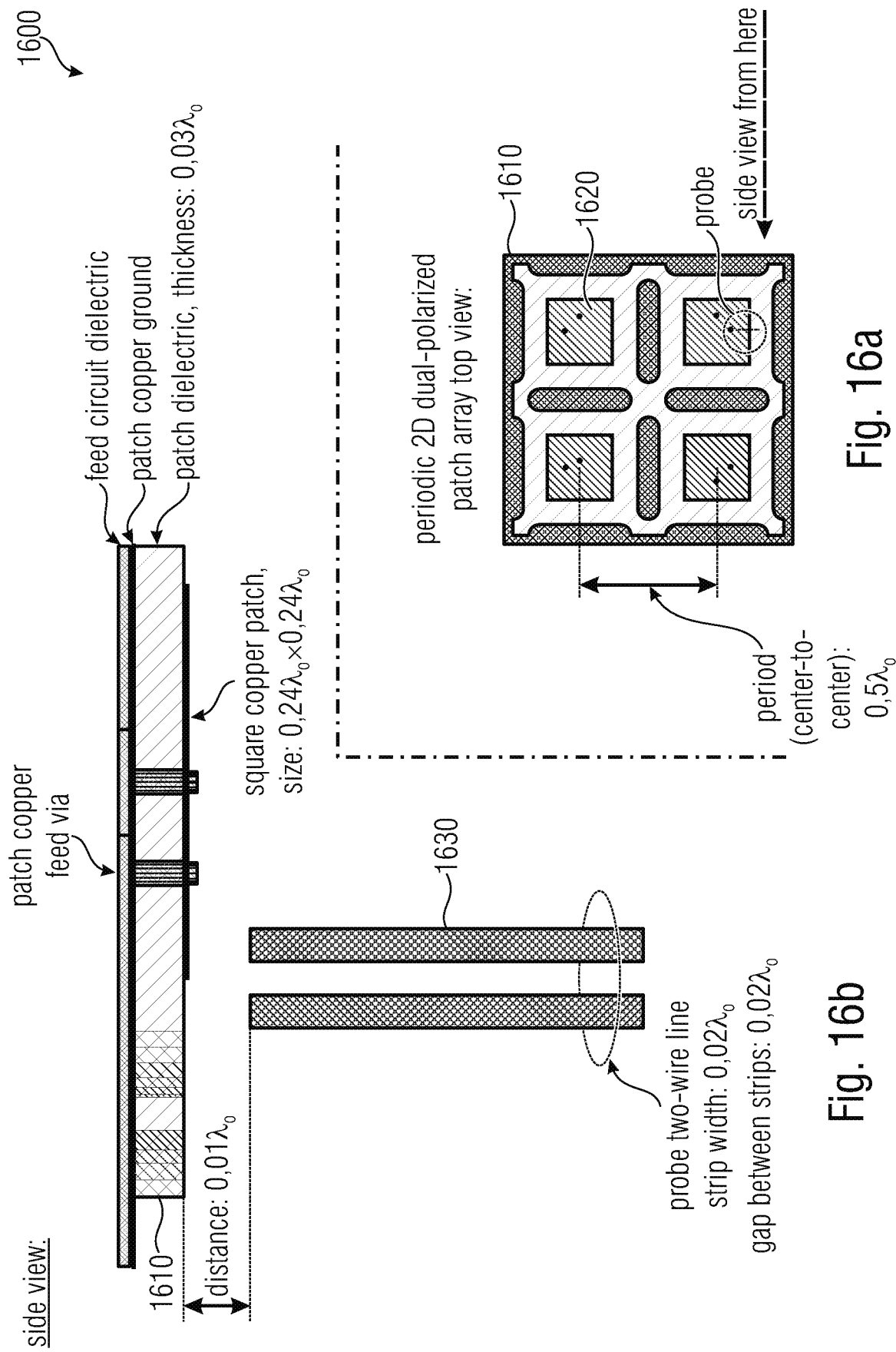

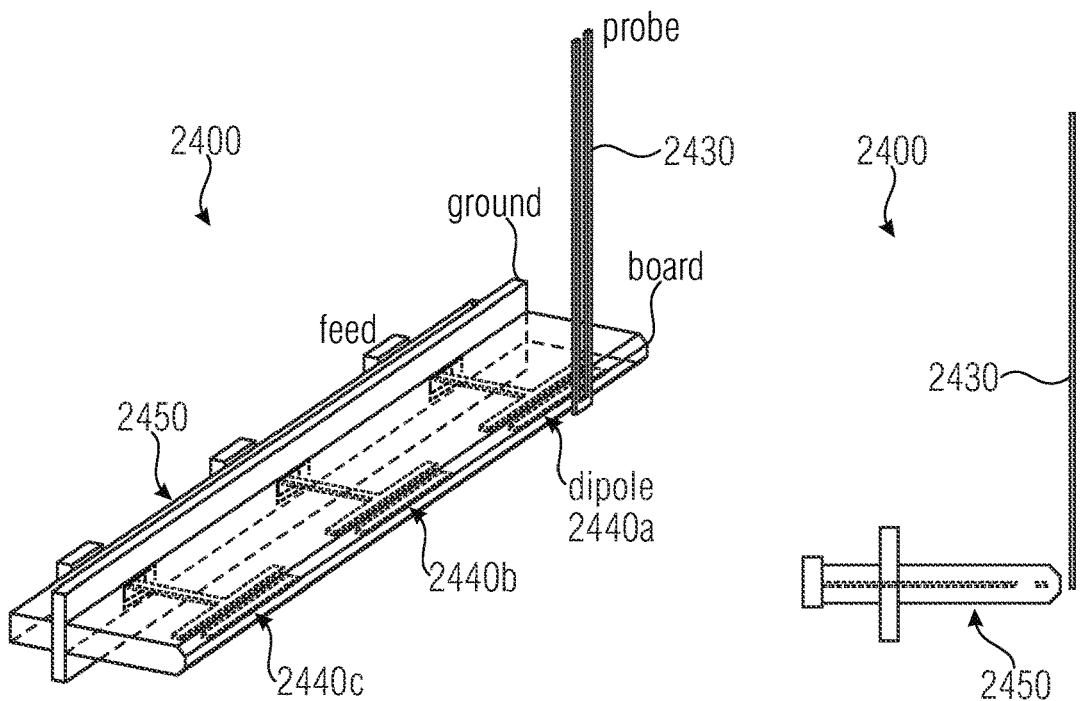
Fig. 24a
Fig. 24b
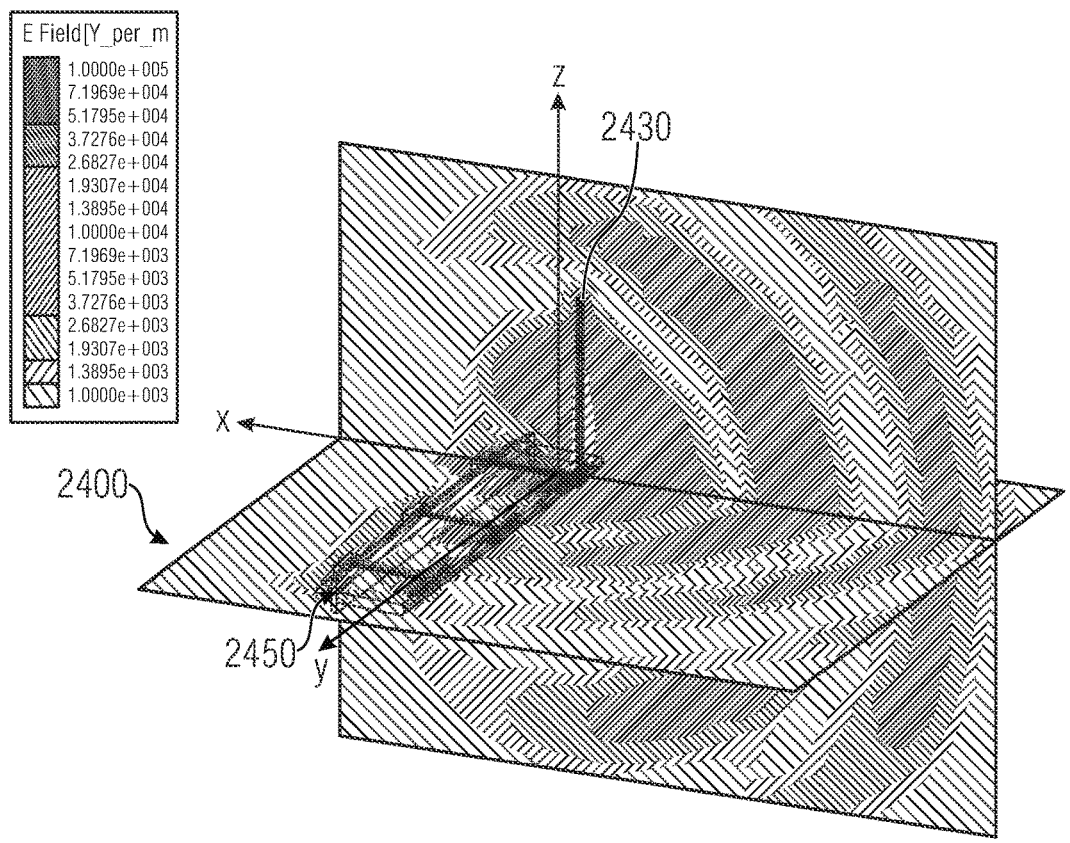
Fig. 24c

TEST EQUIPMENT FOR TESTING A DEVICE UNDER TEST HAVING AN ANTENNA

CROSS-REFERENCE TO RELATED APPLICATIONS

This application is a continuation of copending International Patent Application No. PCT/EP2019/073023, with filing date Aug. 28, 2019, which is hereby incorporated by reference in its entirety.

FIELD

Embodiments of the present invention relate to a tester or test equipment (e.g., automated test equipment) for testing a device under test (DUT). More specifically, embodiments relate to test equipment for testing DUTs having an antenna.

BACKGROUND

With a constant drive for integration, miniaturization and wireless connectivity, a new generation of devices for wireless applications, such as 5G and WiGig, is being developed that use a communication antenna within an integrated circuit die or package instead of a separate antenna as in previous generations. These integrated antennas are usually implemented as antenna arrays having multiple elements.

Wireless mobile or nomadic communication at millimeter-wave frequency promises per-user data rates of gigabits-per-second. Therefore, both WLAN-based and cellular/5G standards envision user access at frequencies as high as, 28 GHz, 39 GHz, 60 GHz or higher. To achieve relevant link distance, despite the high free-space attenuation at millimeter-wave frequency, high-directivity antennas may be employed at both ends of the link; at the base station side as well as at the side of the user device. In order to support mobility and flexibility, new generations of electronic devices may use electronic beam steering using phased array principles at the side of the user device. For example, millimeter-wave frequency spectrum offers frequency bandwidth resources for high-throughput or high-data-rate wireless transmission. As a result, 5G wireless communication such as advanced WiFi systems use millimeter waves. According to Friis' transmission equation $$P_{rec}(r)=P_t G_t G_{rec}(\lambda_0/4\pi r)^2,$$

where:
$P_{rec}$ and $P_t$ are receive power and transmit power,
$G_{rec}$ and $G_t$ are antenna gains,
r is the distance,
and $\lambda_0$ denotes the wavelength of the signal in air,
the high free-space loss or the high attenuation per distance at millimeter-wave frequency may be compensated by high-gain antennas on one or both ends of the wireless link. A high-gain antenna has a narrow beam width. For example, for mobile or nomadic applications, the beam direction of the antenna may be properly adjusted and directed towards the opposite end of the link. This includes adapting the polarization.

For the sake of design compactness, package-integrated antenna array modules are favored, which include one or more multi-transceiver integrated circuits together with a multi-layer planar antenna array. The antenna array form-factor plays an important role. Two-dimensional planar arrays with beams perpendicular to the array (e.g., dual-linear polarized) may be employed together with beams originating from a linear array with end fire (e.g., sideward) radiation.

For example, most applications rely on electronic beam steering and/or beam switching, which does not depend on mechanical means to change the direction of the beam; rather, this can be accomplished using antenna arrays. Although not strictly required, many antenna arrays place the radiating elements of the array close to each other in order to avoid radiation or constructive interference of the respective contributions of the radiators of the array in unwanted directions. For a planar array, a typical distance (e.g., center-to-center distance), between the elements of the array is, for example, approximately 0.6 wavelength, which is a free-space wavelength $\lambda_0$.

A generic antenna array consists of a number of radiator elements on a flat plane, each radiator element allowing radiation in two orthogonal, isolated polarizations in the direction perpendicular to the plane and in a spatial sector centered around this perpendicular axis. The antenna array may be periodic in two directions in the plane, with a periodicity of $0.6 \times \lambda_0$.

The standard operation of such antenna array involves a predictable constructive interference in a given spatial direction of all radiation contributions from the elements of the array. This requires a well-defined operation of each radiator element in magnitude and phase, preferably for both polarizations, including transmit and/or receive electronics.

Rather complex integrated circuits may combine as many as 32 transceiver channels and/or built-in self-test functionality on the chip. The complete radiation module, incorporating one or several integrated transceiver chips and a multi-layer board with a signal distribution and an antenna array, represents a significant packaging complexity and, therefore the module needs to be tested in production. In addition, a user device may include several radiation modules at different, spatially separated positions of the device, and it may operate in multi-beam or MIMO mode. Testing the full set of capabilities of such user device in an over-the-air (OTA) test is extremely involved.

In the past, the antenna was not included in the device under test (DUT). These devices are tested through an electrical connection using standard radio frequency (RF) measurement techniques. Wireless DUTs with integrated antenna arrays in the die or in the package may be tested in their mission mode by a reciprocal antenna or antenna array that measures the wireless signals from the DUT and/or may also provide stimulus signals to the DUT. In other words, the DUT with integrated antenna arrays may not only be tested in a transmission mode of the DUT, but also possible, or in some cases required, to be tested in a receive mode of the DUT. Automated test equipment (ATE) or systems for testing these types of devices require a method and a probe and/or an antenna to receive and stimulate the DUT wirelessly, also referred to as over-the-air (OTA) testing.

A standard approach for measuring a DUT with an integrated antenna array is to use a standard off-the-shelf antenna, like a horn antenna, in the far-field measurement region far away from the DUT on a properly shielded measurement enclosure.

The operation of the array may be tested by measuring the surrounding space with a probe, at some well-defined distance, in order to map radiation intensity, for measuring the transmission, while measuring receiving is similar, over all spatial directions, using spherical coordinates θ and φ. This concept is typically implemented in an antenna anechoic measurement chamber with spherical scanning capability.

In addition to the mechanical complexity of precision spherical scanning, the distance between the array and the probe antenna may be quite large, and the measurement may be done in the far-field region of the array antenna. The minimum distance for far-field is given as, approximately with several constraints, $2 \times D^2/\lambda_0$, where D stands for the maximum dimension of the antenna array, often the diagonal length across the array aperture. This far-field distance may be several meters in the medium-to-high gain millimeter-wave arrays.

Adapting a conventional anechoic chamber approach for far-field measurements becomes a very expensive investment due to the large number of antenna probes, with test transceivers connected, to be mounted in the anechoic chamber. Such approach is also not practical for a production test due to the lengthy measurement time for each device.

This approach, although ideal for a lab type measurement setup, may not be integrated in a standard test cell for high-volume testing of integrated circuits due to the dimensions required. Also, by working in the far-field region with a single antenna, it measures the DUT antenna array as a single beam, where all the antenna elements are radiating and their signals combine into a single beam, instead of each element on the DUT antenna array separately. If the probe antenna approaches each of the individual antenna elements of the antenna array on the DUT, the measurement or probe antenna by itself will disturb the DUT antenna array element and invalidate the measurement.

Alternatively, the probe may scan around the antenna array in a shorter distance, in the so-called radiating near-field. These measured data, which include magnitude and/or phase, may be transformed mathematically, by using a Fourier transformation, to the far-field. To some extent, these data may also be transformed towards the antenna array, until the local field distribution across the radiating aperture is obtained or approximated and a single failed antenna array radiator element may be localized.

Reverting to conventional near-field measurements characterizing electrically large radiating structures by probing them in their radiating near-field, followed by mathematical transformations, is disadvantageous as the measurement time for a DUT becomes large (e.g., when all spatial directions need to be scanned).

For a production test or for calibration of a complete radiation module, it may be sufficient to characterize the path from a given transceiver of the radiation module to the air interface of its connected radiator element. Provided that a test mode of the radiation module supports the sequential test of all transceivers, a single probe antenna placed in front of the array antenna, from a small distance or in the radiating near-field of the antenna array, but still in the far-field of a single radiating element of the array, may be employed to conduct such a test.

In other words, the operation of a single antenna array radiator, together with the associated transmit or receive chain, can be probed in a single spatial direction in magnitude and phase. It is assumed that the radiation properties in all other directions, including couplings with/to other array elements, will work as well, for example, based on the design, simulations or prior measurements of a known-good device. For example, when a probe antenna is placed in front of the array. The elements of the array are selected one after another. The distance between the antenna array and the probe antenna is such that the probe antenna is in the radiating near-field of the array antenna, but in the far-field of the single radiating array element. A non-reflecting and/or absorbing enclosure or absorber material allows for a compact setup.

Despite of the simplicity of the concept, there are several drawbacks. First, as a sequential concept, it may be more time-consuming than a more parallelized approach. Second, depending on the geometry of the setup, the probe antenna "sees" the respective radiating elements of a large antenna array in a compact setup under different angles, such that an absolute measurement is needlessly complicated, and thus only a comparison with a known-good-device is reasonable. Third, couplings from the "switched-on" radiator element to other radiator elements may superimpose in a complex way, such as through a free space but not in a far-field, through board surface waves, or through transceiver mismatch. Therefore, the measured response may not be quantified with confidence.

In view of this situation there is a need for a testing solution which provides an improved compromise between complexity, accuracy and cost for testing DUTs having an antenna element.

SUMMARY

Accordingly, embodiments of the present invention provide apparatus and methods for advantageously testing a DUT wirelessly at a very close range to the DUT, specifically, for instance, within the reactive near-field electromagnetic operating range of the DUT. This approach avoids integration and/or mechanical issues inherent in solutions that test wirelessly within the far-field electromagnetic operating range, where the measurement antenna needs to be far away from the DUT. Furthermore, embodiments of the present invention advantageously enable the measurement of separate individual antenna elements on the DUT antenna array.

According to one disclosed embodiment, a tester for testing a device under test (DUT) is described. The tester includes a DUT-location configured to receive the DUT, the DUT includes an antenna, and the antenna includes an antenna element, and a probe including a first conductor and a second conductor. The probe is disposed in close proximity to the DUT-location and disposed in a reactive nearfield region of the antenna element of the DUT when the DUT is disposed in the DUT-location.

According to some embodiments, the probe is operable to receive a signal transmitted by the antenna of the DUT.

According to some embodiments, the probe is operable to transmit signals to the DUT that are received by the antenna of the DUT.

According to some embodiments, the first conductor and the second conductor of the probe are substantially parallel.

According to some embodiments, the first conductor and the second conductor of the probe act as a transmission line.

According to some embodiments, the transmission line includes a symmetric transmission line at ends of the antenna.

According to some embodiments, the first conductor and the second conductor of the probe are operable to act as a transverse electromagnetic (TEM) transmission line.

According to some embodiments, the first conductor and the second conductor of the probe include a substantially symmetrical transmission line that transitions to a microstrip line.

According to some embodiments, the first conductor and the second conductor of the probe include a substantially parallel strip line that transitions to a coax line.

According to a different embodiment, a tester system is disclosed. The tester system includes a DUT-location configured to receive the DUT, the DUT includes an antenna, and the antenna includes an antenna element, a probe including a first conductor and a second conductor, the probe is disposed in close proximity to the DUT-location, and a circuit operable to combine currents of the first conductor and a second conductor.

According to some embodiments, the circuit includes a balun circuit.

According to some embodiments, the circuit includes a 180 degrees-hybrid to that transitions to an unbalanced line.

According to some embodiments, the first conductor and the second conductor of the probe are separated by a dielectric spacer.

According to some embodiments, the first conductor and the second conductor of the probe are electrically separated from the antenna of the DUT.

According to some embodiments, the probe and the antenna of the DUT are separated by a dielectric spacer.

According to some embodiments, the probe is operable to be disposed in close proximity to a reactive nearfield of the antenna of the DUT.

According to some embodiments, a distance between the probe and the antenna of the DUT is smaller than a distance equal to 10% of a free space wavelength of a signal to be measured.

According to some embodiments, the test system includes another probe, the another probe includes a third conductor and a fourth conductor, the third conductor and the second conductor include separate open-ended non-connecting conductors, the antenna of the DUT includes a patch antenna, and the third conductors and the fourth conductor are disposed near a radiating edge of the patch antenna of the DUT.

According to some embodiments, an automated test equipment (ATE) is disclosed. The ATE includes a tester including a DUT-location configured to receive a DUT for testing, and a probe. The ATE further includes a DUT disposed in the DUT-location of the tester, the DUT comprises an antenna, and the probe is disposed in a reactive near-field of the antenna and is operable to test the DUT.

According to some embodiments, the antenna of the DUT comprises at least one of a planar antenna, a patch antenna, a slot antenna, and a dipole antenna, and the antenna of the DUT is operable to operate at microwave frequencies or millimeter-wave frequencies.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 15a is a diagram depicting an exemplary test simulation from above with a dual-polarized patch antenna array and one parallel strip-line probe according to embodiments of the present invention.

FIG. 15b is a diagram depicting an exemplary test simulation with a dual-polarized patch antenna array and one parallel strip-line probe from a side perspective according to embodiments of the present invention.

FIG. 15c is a diagram depicting an exemplary test simulation with a dual-polarized patch antenna array and four parallel strip-line probes from a side perspective according to embodiments of the present invention.

FIG. 15d is a diagram of an exemplary test simulation with a dual-polarized patch antenna array and four parallel strip-line probes from a side perspective according to embodiments of the present invention.

FIG. 16a is a diagram of an exemplary test simulation with a periodic 2D dual-polarized patch antenna array and a parallel strip-line probe according to embodiments of the present invention.

FIG. 16b is a diagram of an exemplary test simulation with a periodic 2D dual-polarized patch antenna array and a parallel strip-line probe according to embodiments of the present invention.

FIG. 24a is a diagram of an exemplary simulation test for testing a dipole radiator with a shorted parallel strip H-field probe according to embodiments of the present invention.

FIG. 24b is a diagram of an exemplary simulation setup for testing a dipole radiator with a shorted parallel strip H-field probe according to embodiments of the present invention.

FIG. 24c is a diagram of an exemplary E-field magnitude plot of an exemplary test simulation for testing a dipole radiator with a shorted parallel strip H-field probe according to embodiments of the present invention.

DETAILED DESCRIPTION

In the following, different inventive embodiments and aspects will be described. Also, further embodiments will be defined by the enclosed claims.

It should be noted that any embodiments as defined by the claims may be supplemented by any of the details, features and functionalities described herein. Also, the embodiments described herein may be used individually, and may also optionally be supplemented by any of the details, features and functionalities included in the claims.

Also, it should be noted that individual aspects described herein may be used individually or in combination. Thus, details may be added to each of said individual aspects without adding details to another one of said aspects. It should also be noted that the present disclosure describes, explicitly or implicitly, features usable in a test arrangement or in an automatic test equipment (ATE). Thus, any of the features described herein may be used in the context of a test arrangement or in the context of an automatic test equipment.

Moreover, features and functionalities disclosed herein, relating to a method, may also be used in an apparatus configured to perform such functionality. Furthermore, any features and functionalities disclosed herein with respect to an apparatus may also be used in a corresponding method. In other words, the methods disclosed herein may be supplemented by any of the features and functionalities described with respect to the apparatuses.

The present invention will be understood more fully from the detailed description given below, and from the accompanying drawings of embodiments of the present invention, which, however, should not be taken to limit the present invention to the specific embodiments described, but are for explanation and understanding only.

Figure 1:
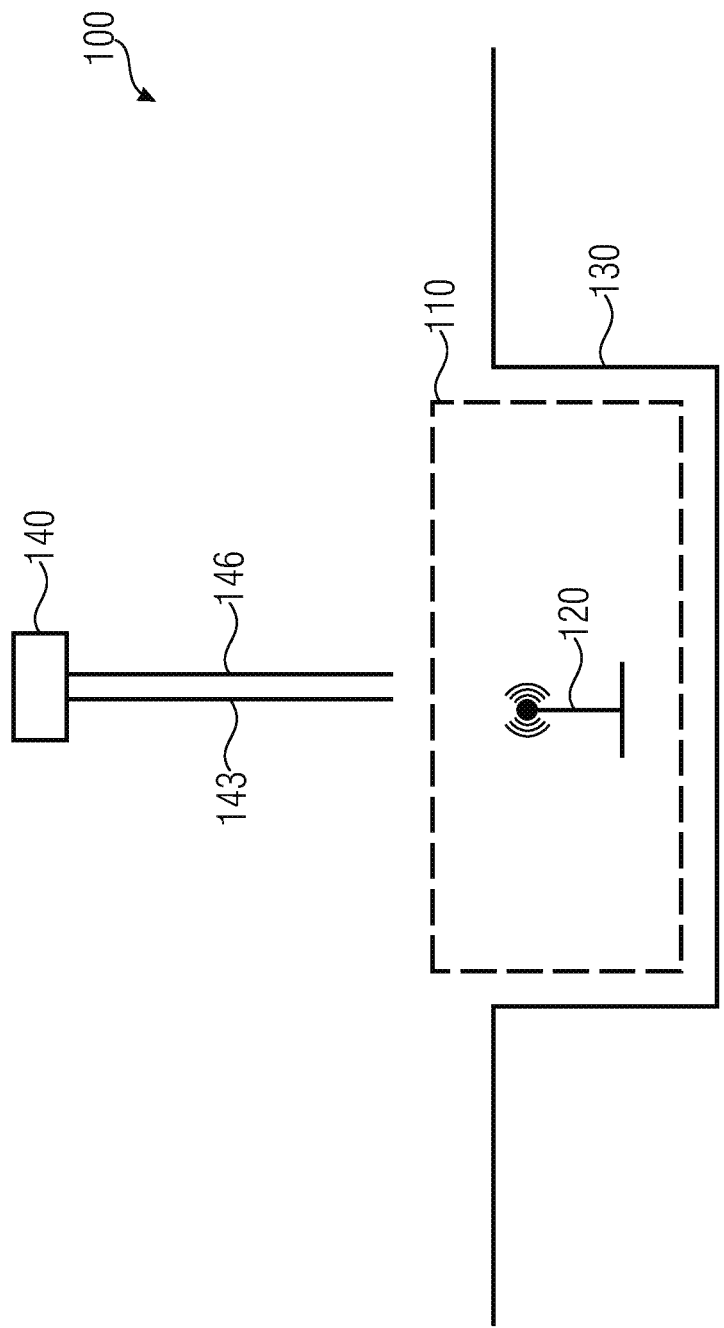
FIG. 1 is a diagram depicting an exemplary tester having a DUT-location and a probe having two conductors according to embodiments of the present invention.

FIG. 1 depicts an exemplary tester 100 for testing a device under test (DUT) 110 including an antenna 120. The tester 100 includes a DUT-location 130 and a probe 140. The probe 140 includes two conductors 143 and 146. The tester 100 is configured to position the probe 140 in close proximity to the DUT-location 130, such that the probe 140 is in the reactive near-field region of antenna 120 or of an antenna element of the DUT 110 when the DUT 110 is disposed in DUT-location 130.

The DUT-location 130 of the tester 100 is configured to receive the DUT 110, and the two conductors 143 and 146 of the probe 140 are disposed in the reactive near-field region of the antenna 120 of the DUT 110 to test the DUT 110. According to some embodiments, the two conductors 143 and 146 can be transverse electromagnetic (TEM) transmission lines, for example.

An adapter or probe 140 is used to wirelessly "over-the-air" (OTA) electronically test a DUT 110 with an embedded antenna 120 or antenna array with the measurement probe 140 located in close proximity to the DUT 110. For example, the probe 140 can be located very close to the DUT 110 (e.g., in the near-field region). Although the probe 140 is located in close proximity to the DUT antenna 120 or antenna array elements it does not significantly disturb or interfere with probe 140 during testing.

According to some embodiments, the probe 140 is a high-frequency line formed by parallel needles 143 and 146 placed over the local radiating point above the DUT antenna 120 or above the DUT antenna array element without galvanic or electrical contact between the probe 140 and the DUT antenna 120 or the DUT antenna array element. In other words, there is some physical separation between the probe 140 and the DUT antenna 120, and mechanical contact between the probe 140 and the DUT antenna 120 is optionally allowed. In some cases the probe 140 will receive a signal from the radiating point of the antenna element 120, without disturbing it significantly. In other cases test signals are fed to the probe 140, and the DUT antenna 120 receives the signal from the radiating probe 140.

Figure 2:
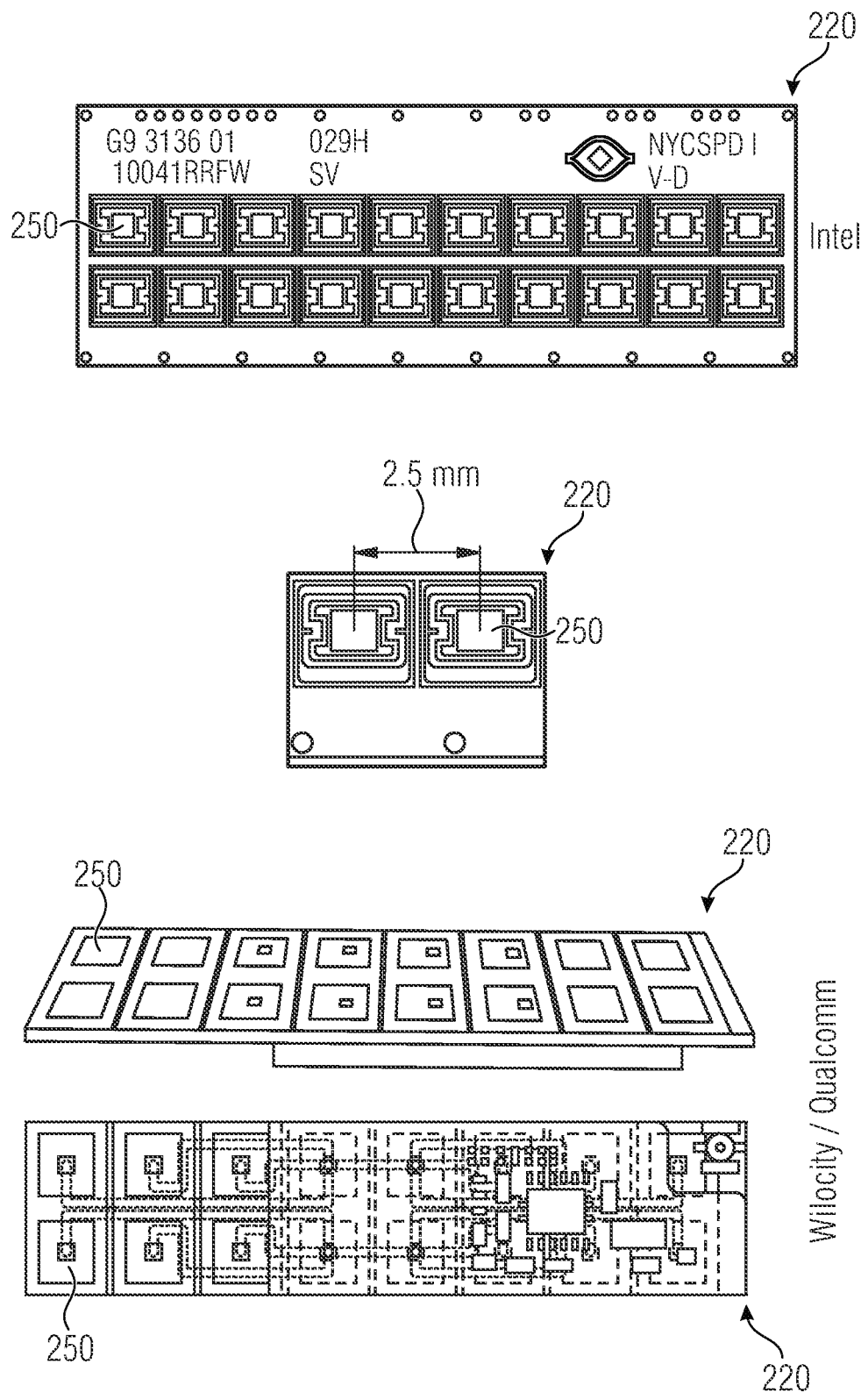
FIG. 2 is a diagram depicting exemplary antenna and antenna arrays of a DUT according to embodiments of the present invention.

FIG. 2 depicts an exemplary antenna array 220 including a plurality of antenna elements 250 according to embodiments of the present invention. The arrangement of the antenna elements 250 of the antenna array 220 can be periodic in two directions in the plane (e.g., a periodicity of between $0.5 \times \lambda_0$ and $0.6 \times \lambda_0$). These array antennas 220 are housed by a DUT and can be measured or characterized by testers of the embodiments described herein. The tester 100 depicted in FIG. 1 can measure each antenna elements 250 of the array antenna 220 individually.

Figure 3:
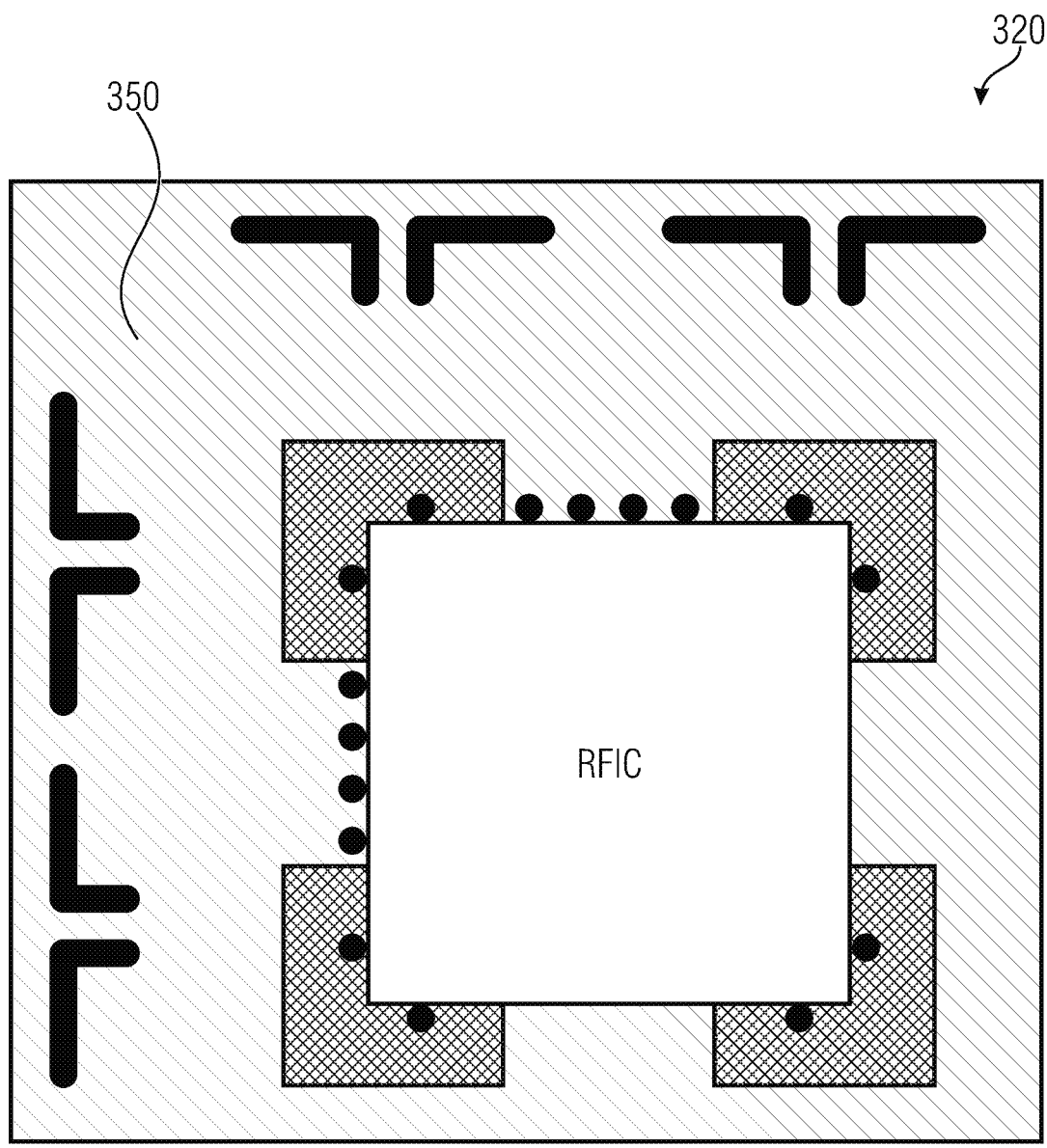
FIG. 3 is a diagram depicting an exemplary antenna arrays having an RFIC according to embodiments of the present invention.

FIG. 3 depicts an exemplary antenna array 320 including a plurality of antenna elements 350 and four antenna elements 350 in a 2×2 configuration according to embodiments of the present invention. Electronic circuit ("RFIC") is coupled to the antenna array 320 and a dipole antenna array with four dipole antenna radiator elements. The antenna elements 350 of the antenna array 320 can be periodic with a periodicity of between $0.5 \times \lambda_0$ and $0.6 \times \lambda_0$. The antenna array 320 is housed by a DUT and can be measured or characterized by testers of the embodiments described herein. The tester 100 on FIG. 1 can test the antenna elements 350 of the antenna array 320 individually.

Figure 4:
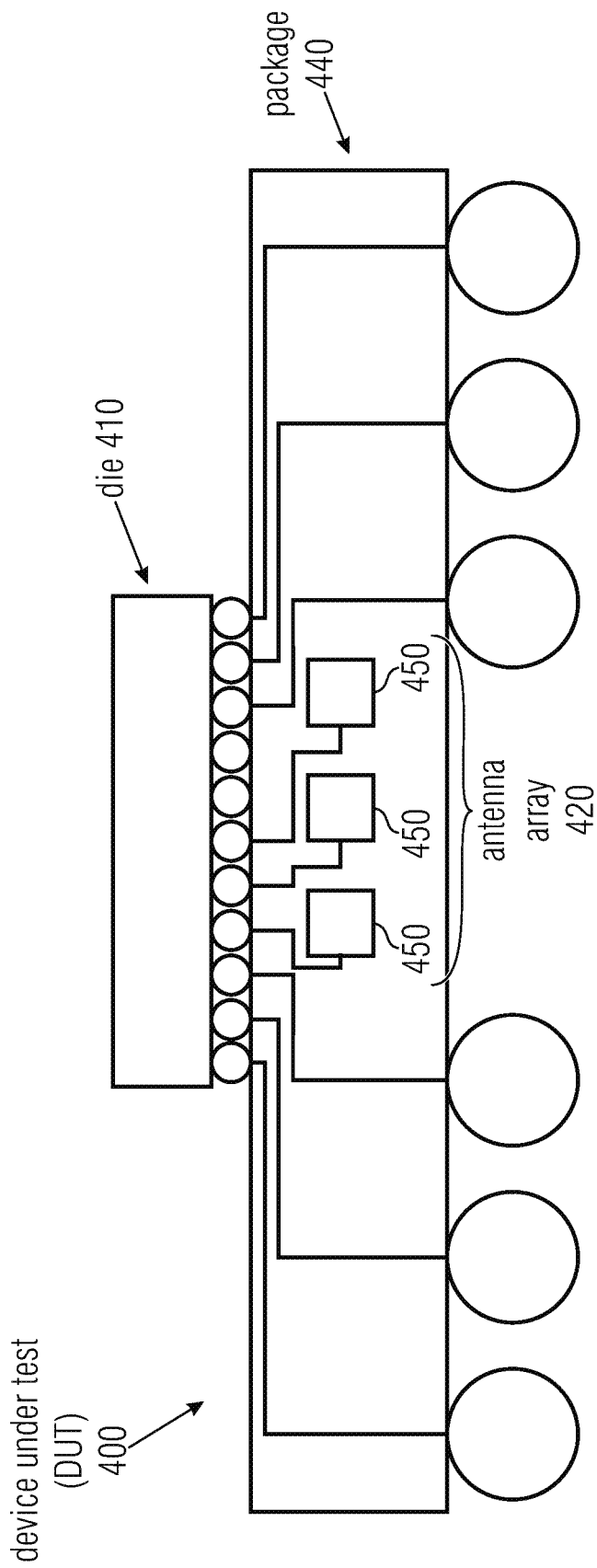
FIG. 4 is a diagram depicting a DUT to be tested in the tester depicted in FIG. 1 according to embodiments of the present invention.

FIG. 4 depicts an exemplary DUT 400 that can be tested by the tester 100 on FIG. 1 according to embodiments of the present invention. The DUT includes a die 410 coupled to a package 440. The package 440 further includes an antenna array 420 similar to the antenna array 220 on FIG. 2 or to the antenna array 320 on FIG. 3. The antenna array includes a plurality of antenna elements 450 coupled to the die 410.

The tester 100 on FIG. 1 is can test the signals transmitted by the antenna elements 450 of the antenna array 420 housed by the package 440 and coupled to the die 410. According to some embodiments, tester 100 provides a probe with test signals and the antenna of the DUT receive the signals from the radiating probe. Some wireless DUTs with integrated antenna arrays in the die or package may only be tested using a specific antenna or antenna array that measures the wireless signal from the device under test and provides stimulus signals to the DUT. According to some embodiments, the DUT is simulated wirelessly using over-the-air (OTA) testing.

To test a DUT antenna array or antennas wirelessly, a probe, such as probe 140 depicted in FIG. 1 or probe 2430 depicted in FIG. 24, probes or receives a wirelessly transmitted signal. The DUT can be coupled to an ATE via galvanic or electrical contacts coupled to DUT metal contact pads or metal contact balls, such as the balls shown in FIG. 4.

Figure 5:
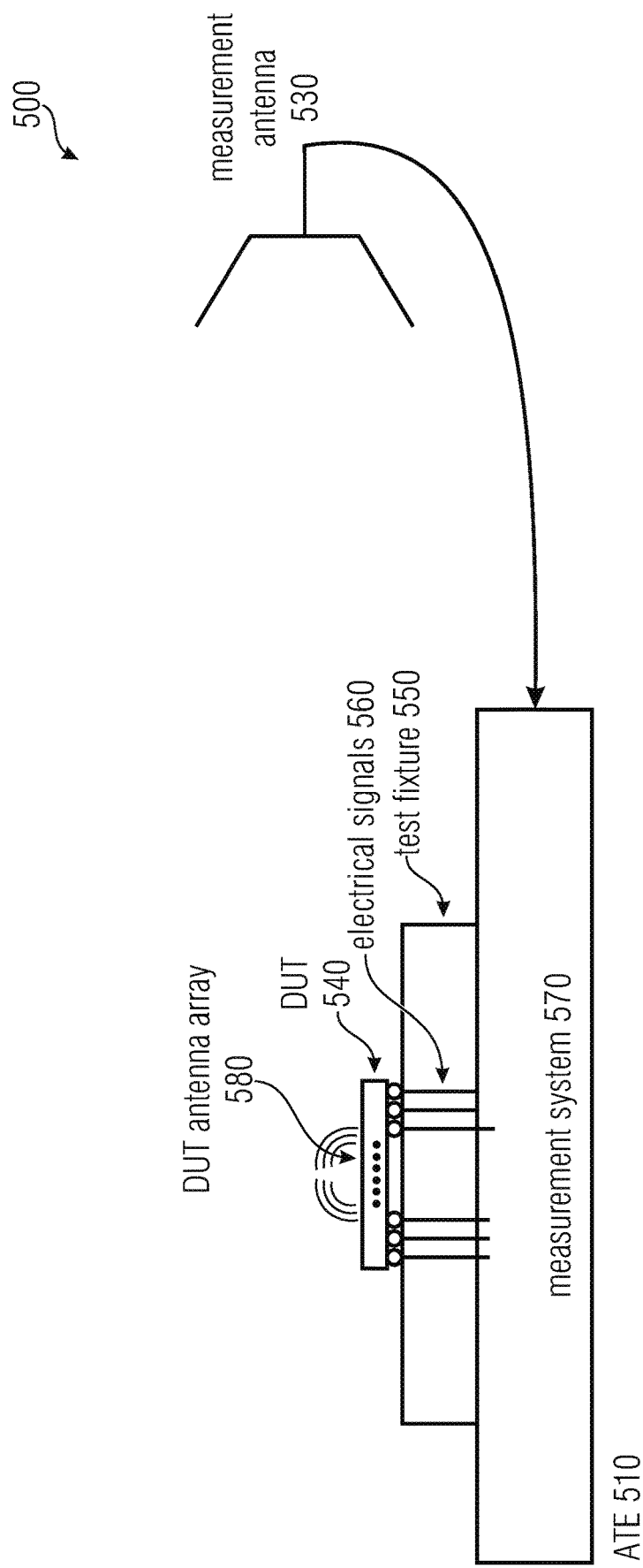
FIG. 5 is a diagram depicting a measurement system for testing an array antenna of the DUT.

FIG. 5 depicts an exemplary tester 500 including an ATE 510 and a measurement antenna 530 coupled to the ATE 510 according to embodiments of the present invention. The ATE 510 further includes a measurement system 570, a test fixture 550 and a DUT 540. The DUT 540 is disposed in the test fixture 550 and is electronically connected to the measurement system 570. The DUT 540 further includes a DUT antenna array 520. The measurement system 570 of the ATE 510 sends electronic signals 560 to the DUT antenna array 520 of the DUT 540. The DUT antenna array 520 transmits signals 580 based on electronic signals 560 received from measurement system 570. The transmitted signals 580 of the DUT antenna array 520 are received by a measurement antenna 530. The measured signals of the measurement antenna 530 are sent to and analyzed by the measurement system 570 of the ATE 510 in order to test the DUT antenna array 520. In order to test the receive functionality of the DUT, the measurement antenna 530 transmits a signal, which is received by the DUT antenna array 520.

One approach for measuring the DUT with an integrated antenna array is to use a standard of-the-shelf antenna like a horn antenna in the far-field measurement region, far away from the DUT, in a properly shielded measurement enclosure. This approach, although ideal for a lab-type measurement setup, may not fit in a standard test cell for high-volume testing of integrated circuits. Moreover, by working in the far-field region with a single antenna, the DUT antenna array can be measured as a single beam, with all the antenna elements combined into a single beam. The elements of the DUT antenna array, however, may be tested separately, if the DUT supports a test mode that selects, sequentially in time, one antenna element of the DUT antenna array after the other. This approach increases testing time significantly and might not be a viable option in high-quantity production test.

Figure 6:
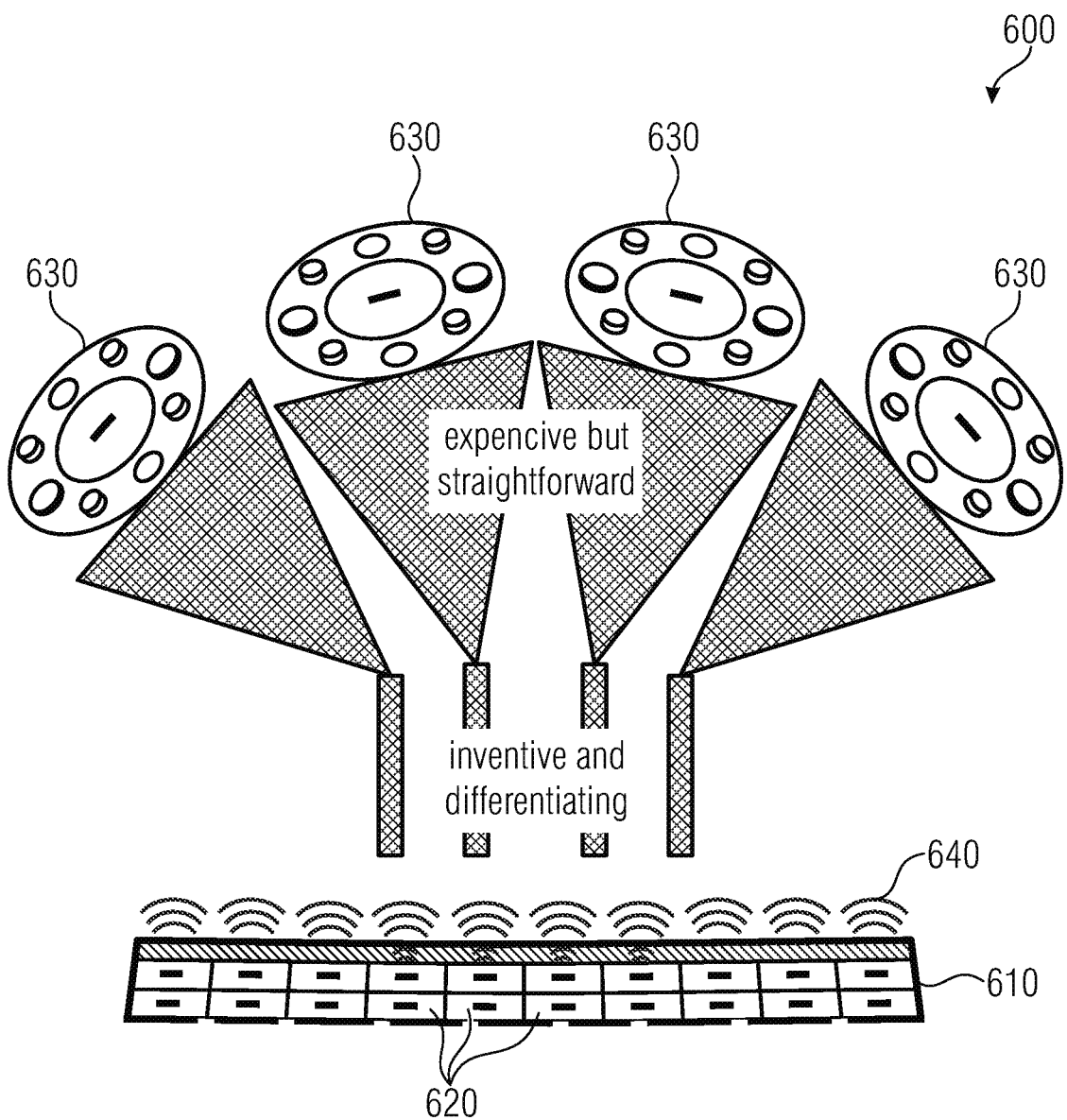
FIG. 6 is a diagram depicting an exemplary measurement for testing an array antenna of the DUT according to embodiments of the present invention.

FIG. 6 depicts an exemplary measurement system 600 for testing an antenna array 610 including antenna elements 620. The measurement system 600 includes antenna array 610 and connector structures 630 in the radiating near-field measurement region of the antenna array 610. The connector structures 630 may act as a signal distribution networks for coupling the new probes with standard RF connectors, such as rectangular waveguide flanges in the example of FIG. 6, or coaxial connectors.

The radiation 640 of the antenna elements 620 of array 610 is sampled/probed/tested. Probes can be connected/transitioned using well-known techniques, such as lines, hybrids, dividers/combiners and switches, to connectors 630, (coaxial or, as shown, rectangular waveguide) and to standard measurement RF equipment.

The interference of the signals 640 of the antenna elements 620 are spherically scanned around the array or antenna array 610 in the radiating near-field. The measurements, e.g., magnitude and phase, may be transformed mathematically using a Fourier transformation to the far-field. The data may also be transformed toward the antenna array 610, until the local field distribution across the radiating aperture is approximately obtained. Then, single-phase antenna radiator elements may be localized. The cost, size, and scanning time of the spherical scanning system, however, are preventing the use of such apparatus for a production test of antenna arrays 610.

The tester 100 on FIG. 1 offers an improved OTA testing solution for testing electronically the DUT with an embedded antenna array. The measurement probe of the tester tests the antenna elements of the antenna array individually without disturbing their signals by working in the near-field region of the DUT.

Figure 7:
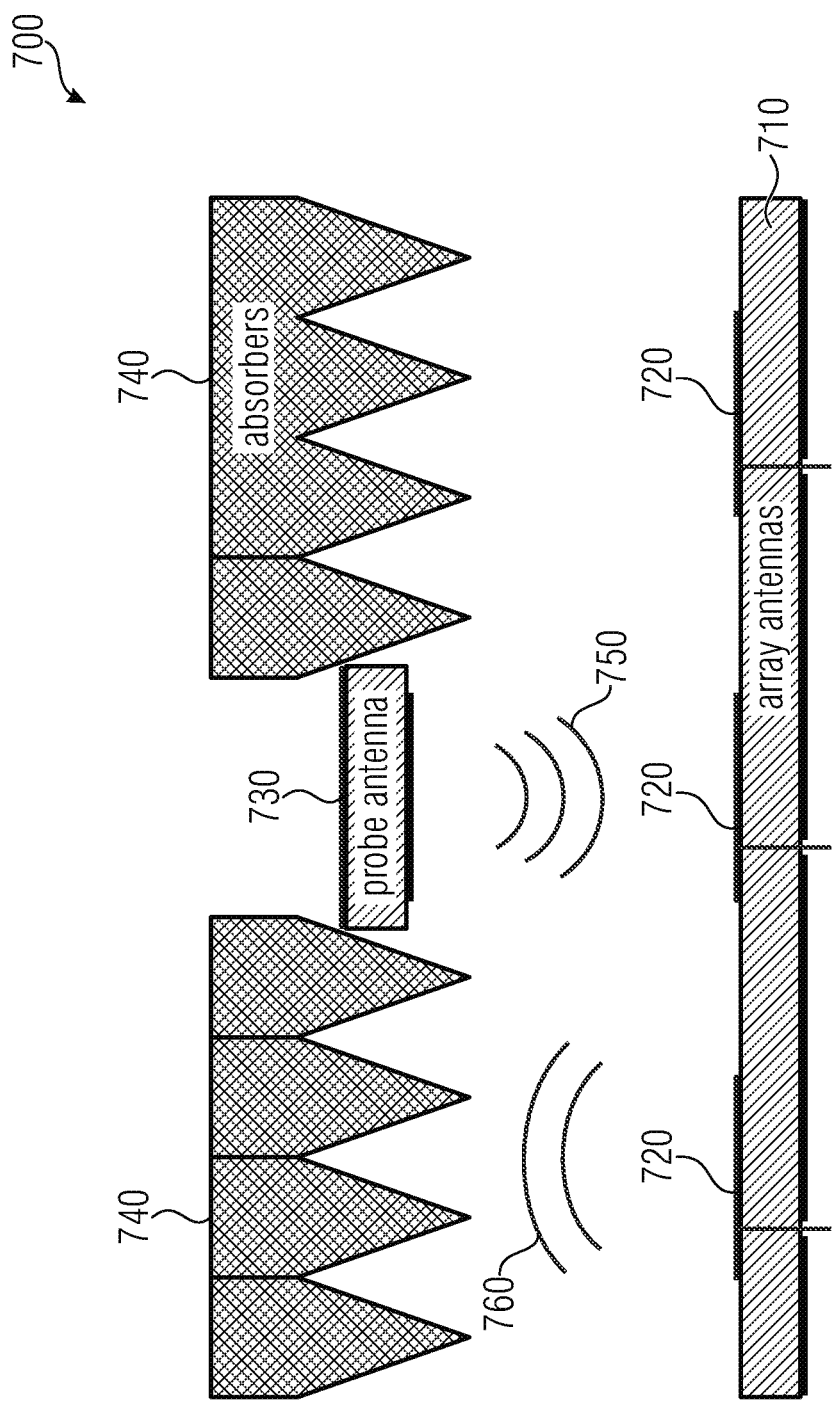
FIG. 7 is a diagram depicting a tester for testing an array antenna of the DUT.

FIG. 7 shows a tester 700 for testing an array antenna 710 of a DUT. The tester 700 includes an array antenna 710, which includes antenna elements 720, a probe antenna 730 and absorbers 740. The probe antenna 730 is disposed in the radiating near-field of the array antenna 710. The absorbers 740 are placed around the measurement area in order to reduce unwanted reflections and couplings.

The probe antenna 730 is sending probe signals 750 to the antenna elements 720 of the antenna array 710. The probe signal 750 is received by the antenna elements 720. The probe signal 750 is used for testing the array antenna elements individually, that means testing the antenna elements 720 one-by-one. Reflections 760 of the probe signal 750 are absorbed by the absorber 740.

In the example of FIG. 7, a probe antenna in a far-field distance connects to each of the array radiators, sequentially, one after another. In other words, the operation of a single antenna array radiator 720 (and the signal transmitted or received) is probed with a probe signal 750 in a single spatial direction and in a single magnitude and a single phase. For example, a probe antenna can be placed in front of the array. The elements of the array are selected one after the other. The probe can be in the radiating near-field of the array, and in the far-field of a single radiating array element. A non-reflecting and/or absorbing enclosure allows for a compact setup. In order to test the transmit functionality of the DUT, the probe antenna 730 receives the signal transmitted by the DUT antennas 720.

There are several drawbacks to this approach:
1. Only one radiator element, or in fact, only one polarization of a single element of the array antenna, may be tested at a time for a transmit and/or a receive mode; and
2. The measured "good" status of the radiator element is different for elements placed at different positions in the array. This is because the relative position of the array element with respect to the probe antenna varies. The measurement of a "known-good-device" must provide the "good" characteristics for each radiator element.

In contrast, the tester 100 on FIG. 1 offers an improved OTA testing solution for testing electronically the DUT with an embedded antenna array. The measurement probe of the tester tests the antenna elements of the antenna array individually without disturbing (or without significantly disturbing) their signals by working in the reactive near-field region of the DUT.

Figure 8:
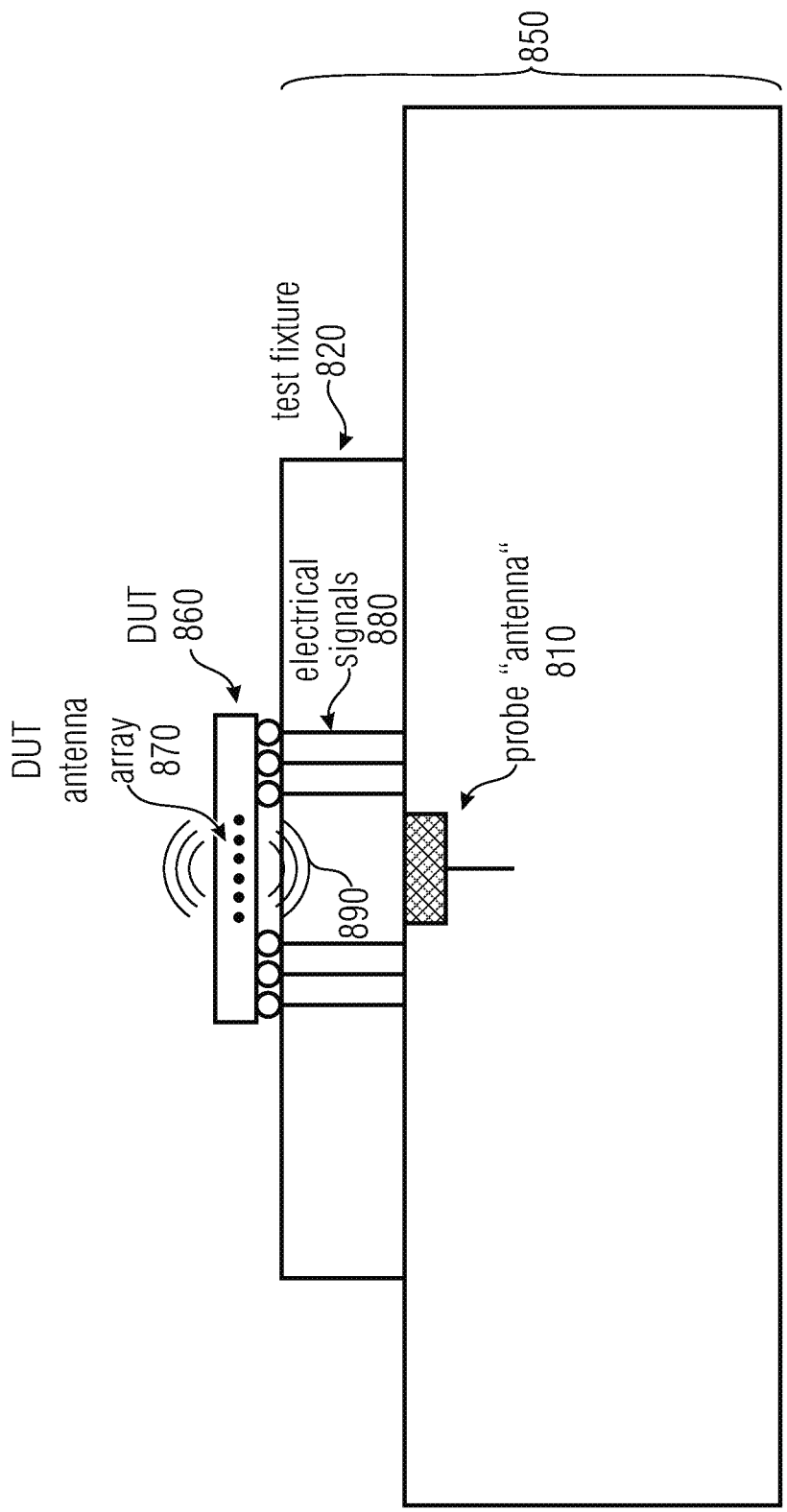
FIG. 8 is a diagram depicting an exemplary of an automated test equipment (ATE) including the tester depicted in FIG. 1 according to embodiments of the present invention.

FIG. 8 depicts an automated test equipment (ATE) 800 including a tester 850 similar to the tester 100 on FIG. 1, and a DUT 860, according to embodiments of the present invention. The tester 850 includes a measurement probe 810 and a test fixture 820 or DUT-location. The DUT 860 is disposed in the test fixture 820 and is electronically coupled to the tester 850. The DUT 860 includes a DUT antenna array 870, which is capable of sending wireless signals 890 according to the electronic signals 880 of tester 850. The antenna elements of the DUT antenna array 870 are probed by the probe antenna 810, disposed so that the test fixture 820 is between the DUT 860 and the probe antenna 810.

The tester 850, which is similar to the tester described above, in an ATE 800 is sending electrical signals 880 to the DUT antenna array 870 of the DUT 860. The DUT antenna array 870 transmits signals 890, which are received by the probe antenna 810 of the tester 850. The received signals are used to test the DUT 860. Because the probe of the tester 100 on FIG. 1 may be placed very close to the DUT, it may be easily integrated in automated test cells or in DUT-locations that may be used to electronically test large volumes of integrated circuits.

Figure 9:
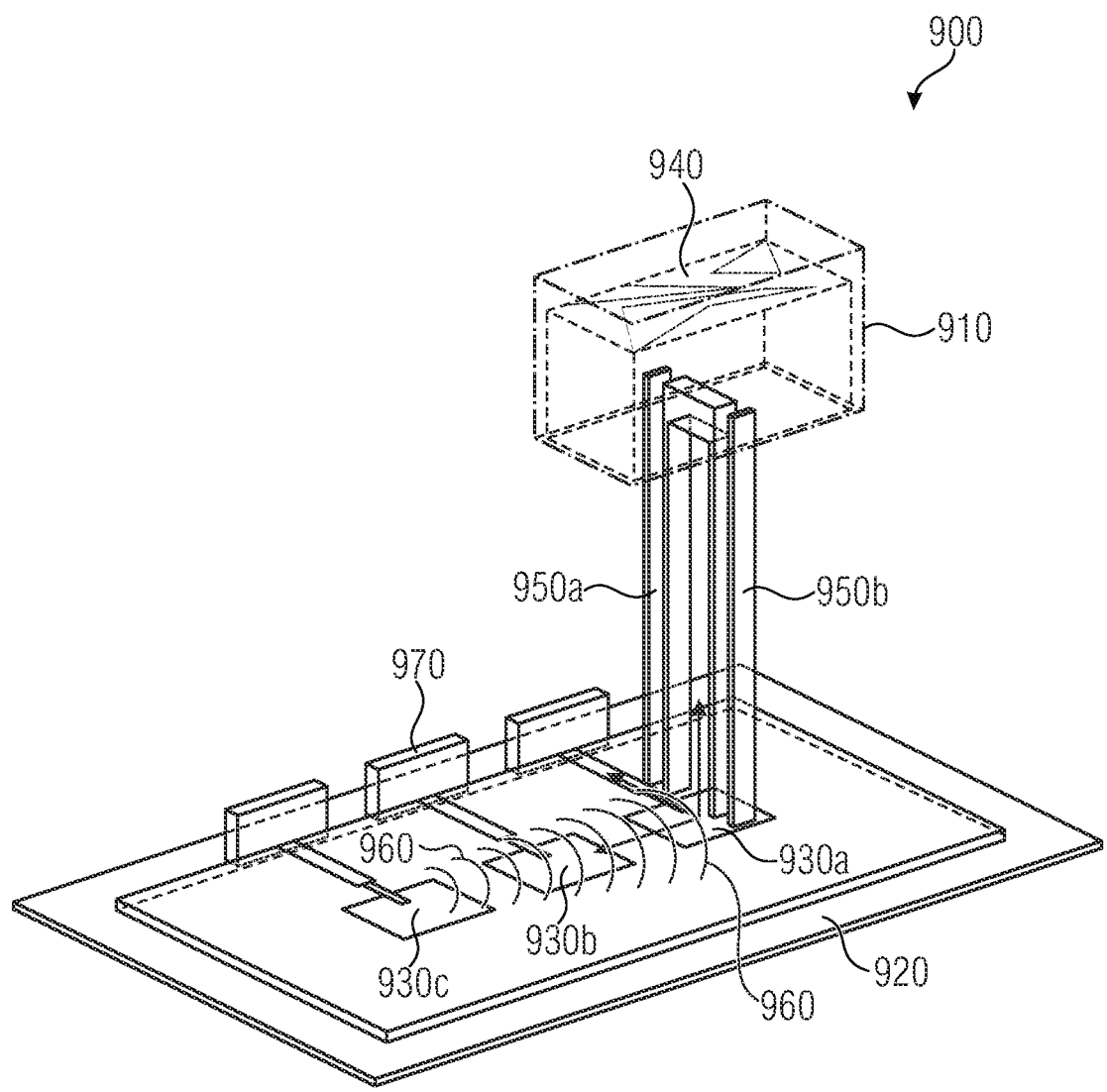
FIG. 9 is a diagram depicting an initial test simulation of an ATE according to embodiments of the present invention.

FIG. 9 depicts an initial simulation test of an ATE 900 including a tester 910, similar to the tester 100 on FIG. 1, and a DUT 920, according to embodiments of the present invention. The DUT 920 further includes an array antenna 970 with antenna elements 930a-c. The tester 910 includes a feed structure 940 and two conductor-pairs or probe antennas 950a and 950b (e.g., TEM-line multi-line probes). The DUT antenna array elements 930a-c of the antenna array 970 of the DUT 920 are transmitting a signal 960. The tester 910 is configured to measure the signal 960 of the DUT antenna array element 930a. The signal 960 of the element 930a is received by the probe antennas 950a and 950b and forwarded to the feed structure 940. The patch array is dense with a distance between the antenna elements 930 just slightly more than $\lambda_0/2$ according to embodiments. The probe uses TEM-lines 950a and 950b (two separate wires) for receiving some electric field in the near-field region of the antenna element 930a. The simulation (or the arrangement) may be improved by absorbers, and the distance between the antenna element 930a and the conductor wire-pairs 950a and 950b of the probe is less than $\lambda_0/10$ so that the probe is in the reactive near-field region of the antenna element 930a. Four wire-pairs may (optionally) be used for one dual-polarized patch antenna element or slot ring.

In one example, the simulation shows small detuning while next-neighbor patches 930b and 930c couple approximately 15 dB less than a probed patch 930a. Simulating the behavior of tester 100 on FIG. 1 can be accomplished via OTA testing a single embedded antenna array element 930a, provides useful insight and/or aspects about the tester and/or the measurement probe of the tester.

Figure 10:
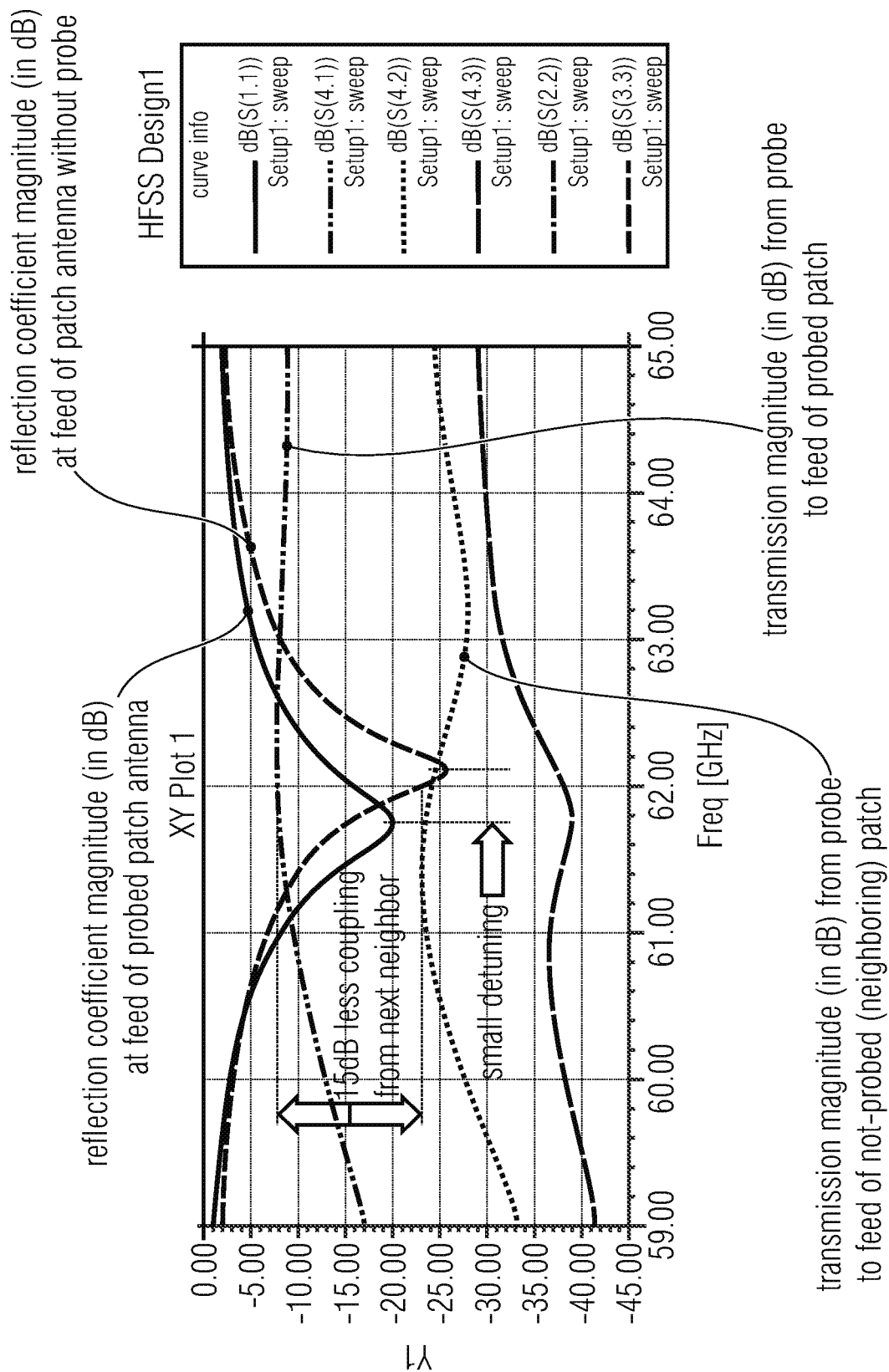
FIG. 10 is a diagram depicting a simulated test measurement with the simulated ATE depicted in FIG. 9 according to embodiments of the present invention.

FIG. 10 shows the results of simulated measurements of the simulated tester depicted in FIG. 9. The results show that the signal from the DUT antenna array element 930a is measured by the needle-pair probe 950a and 950b at a reasonable strength with insignificant disturbance on the DUT antenna array element 930a from the needle-pair probe 950a and 950b. There is only minimal coupling from the other antenna array element into the needle pair. Simulating the behavior of a tester 100 on FIG. 1 via OTA testing a single embedded antenna array element provides useful insight and details about the tester and/or the measurement probe of the tester. Results of the simulation show a small detuning while the next neighbor patch couples are approximately 15 dB less than the probed patch. Even with a relatively large needle-pair probe 950a and 950b in this exemplary simulation, the detuning of the probed patch remains relatively small (shown in FIG. 10) and the coupling to the next un-probed neighbor remains relatively small (shown in figure FIG. 10). Other embodiments use finer metal needles forming the needle-pair probes, thereby further reducing detuning and next-neighbor coupling.

Figure 11:
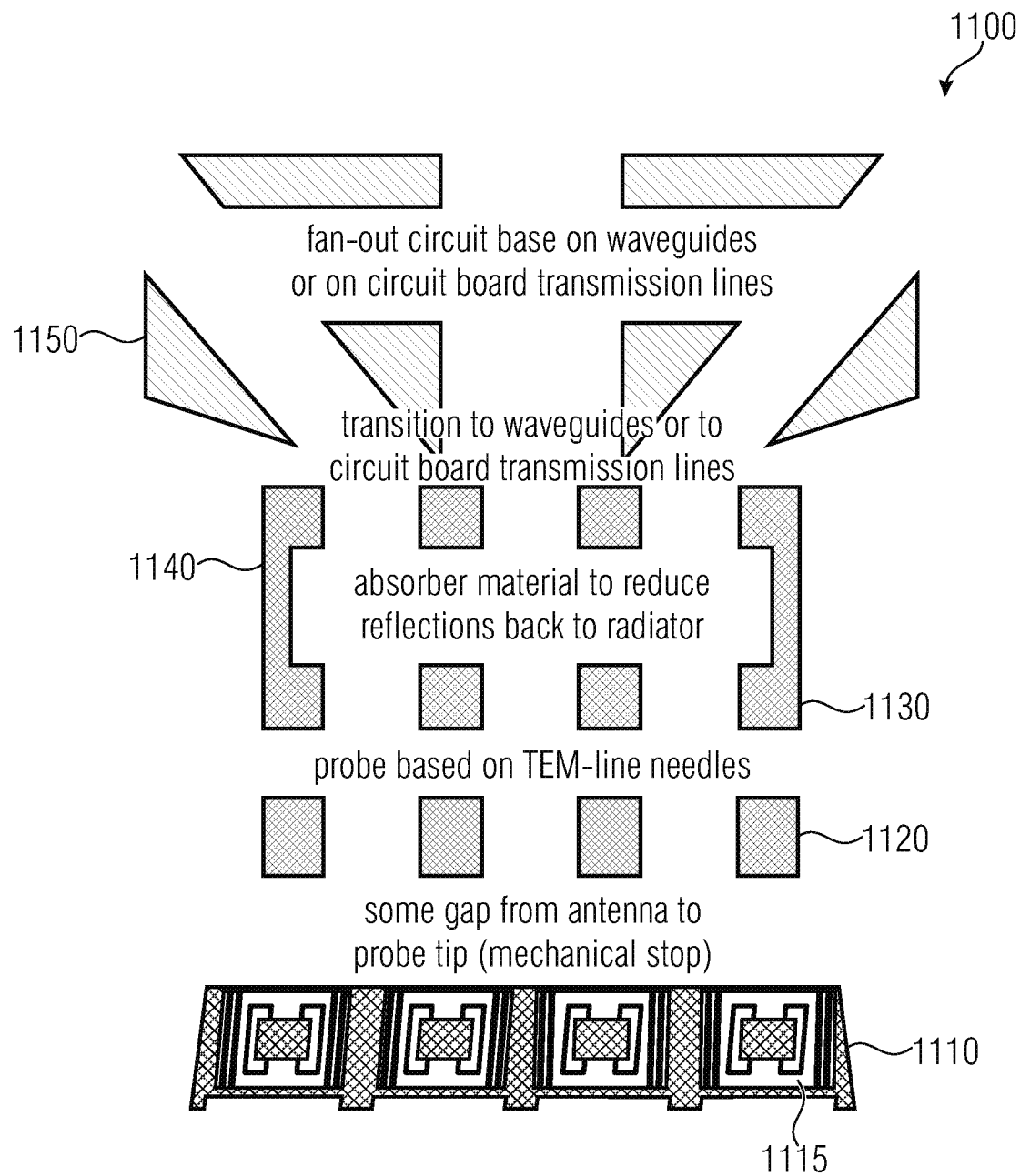
FIG. 11 is a diagram depicting an exemplary probe for use in a tester according to embodiments of the present invention.

FIG. 11 depicts an exemplary probe 1100 for use with a tester, such as tester 100 depicted in FIG. 1. The probe 1100 has an antenna array 1110 which includes antenna array elements 1115. The array antenna 1110 is separated from the probe tips 1120 with a gap. The gap between the array antenna 1110 and the probe tip 1120 may be, for example, a mechanical stop. The probe tip 1120 is at the antenna side of the probe. The probe 1130 is can include TEM-line needles, for example. Between the probe tip 1120 and the feed side of the probe 1130, absorbent material 1140 is used to reduce reflections back to the radiator or to other antenna array elements 1115. On the feed side of the probe 1130, transition circuitry is used to apply a transition on the signal to waveguides or to circuit board transmission lines. Fan-out circuits are then based on waveguides or on the circuit board transmission lines.

According to some embodiments, the probe (or the probe tip) is disposed in the reactive near-field of a radiator or an antenna array element 1115, the probe is placed in a mechanically reproducible way, the probe is not (or, at least, not significantly) affecting the feed impedance of said radiator or of the antenna array element 1115, the probe is not (or, at least, not significantly) affecting the other radiators or other antenna elements 1115, and the probe is decoupled (or, at least, significantly decoupled) from other probes and the other radiators or antenna elements are not coupled into the probe. The setup may be calibrated in terms of transmission, of phase and magnitude, and in terms of coupling. The setup may be calibrated end-to-end or by reflections from a large flat metal plate or by transmission-line reflections from the open-ended needle-pair probes with any physical material removed within some distance from the probe ends.

Figure 12:
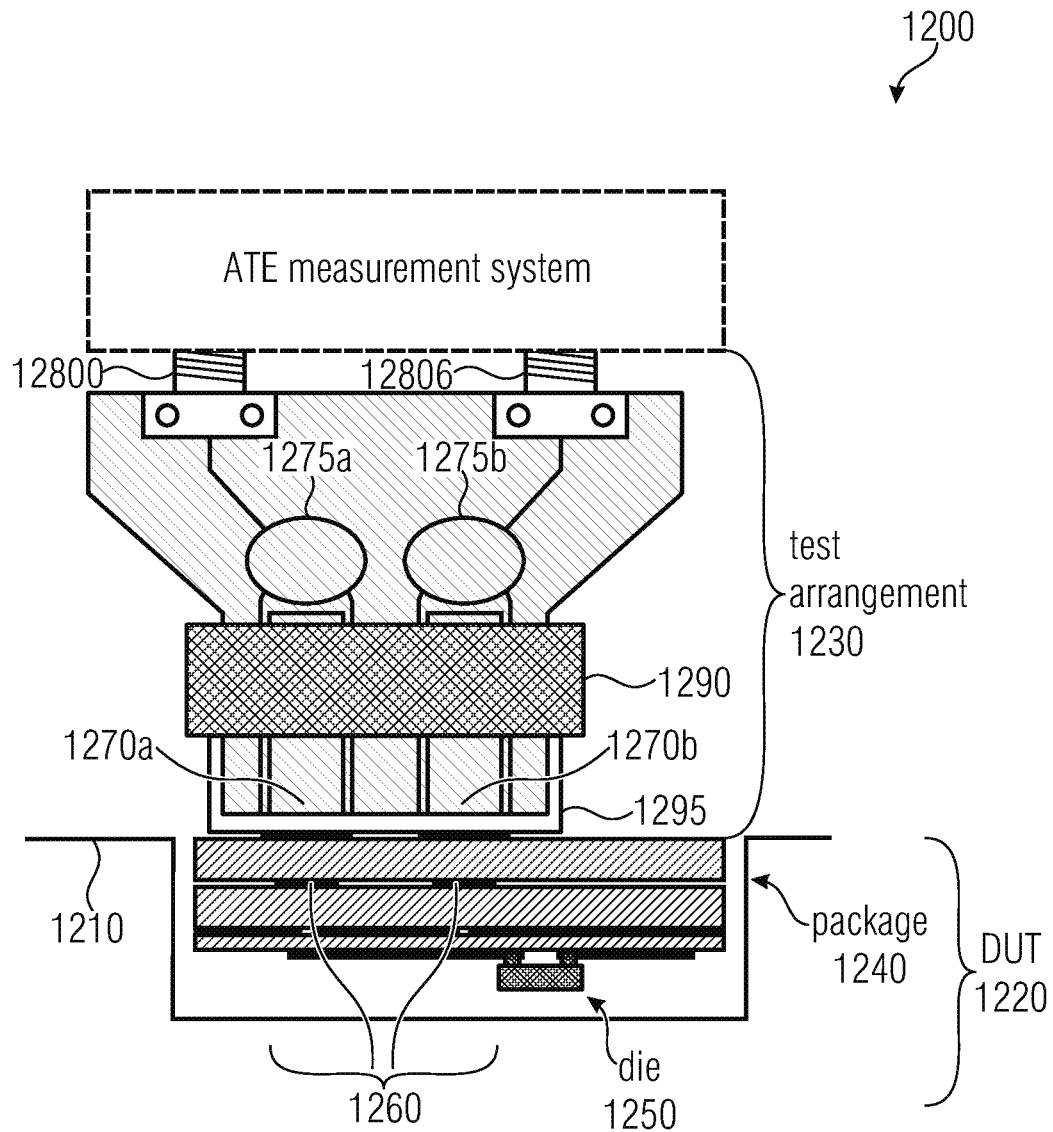
FIG. 12 is a diagram depicting an exemplary ATE for use with the exemplary probe depicted in FIG. 11 according to embodiments of the present invention.

FIG. 12 depicts an exemplary ATE 1200 including a tester 1230 (such as the tester 100 depicted in FIG. 1) and coupled to a DUT 1220 according to embodiments of the present invention. The tester 1230 includes two probe-pairs 1270a and 1270b and a DUT-location 1210. The first probe-pair 1270a is coupled to a first balun 1275a and the second probe-pair 1270b is coupled to a second balun 1275b. The first balun 1275*a* is coupled to a first feed structure 1280*a* and the second balun 1275*b* is connected to a second feed structure 1280*b*. The tester further includes an absorber material 1290, placed between the antenna array 1260 and the baluns 1275*a* and 1275*b*. The tester 1230 further includes a dielectric spacer 1295 between the ends of the two needle-pair probes 1270*a* and 1270*b* and the DUT 1220, which is placed in the DUT-location 1210. The DUT 1220 includes, for example, a package 1240 and a die 1250. The package 1240 further includes an antenna array 1260 including two (or more) antenna elements connected to the die 1250.

The antenna elements in the antenna array 1260 of the DUT 1220 are fed through the die 1250. The signals transmitted by the antenna array 1260 are received by the two probe-pairs 1270*a* and 1270*b*. The balanced currents of a probe-pair 1270 and 1270*b* are combined using a respective balun 1275*a* and 1275*b* to transition to a respective unbalanced feed 1280*a* and 1280*b*.

According to some embodiments, the antenna array of the DUT 1220 is a stacked WiGig patch antenna, with a frequency, for example, between 57 and 64 GHz. The two needle-pair-probes 1270*a* and 1270*b* are a two-wire transmission line with a needle-like near-field probe disposed above the radiating slot. In other words, each of the needle-pair-probes 1270*a* and 1270*b* form a two wire transmission line with an open end in the reactive nearfield of the antenna of the DUT. The probe-pair is fed by a rat-race balun, or a 180° hybrid where several probes (and possibly the circuitry) are placed on a single PCB. The dielectric spacer 1295 or the distance holder are made of or using plastic and/or foam. An absorber 1290 is optionally added to prevent resonances and couplings.

The signal wirelessly transmitted by the DUT is probed and is then accessible at the feeds 1280*a* and 1280*b* (test of DUT transmit mode). Alternatively, a signal injected in the feeds 1280*a* and 1280*b* is wirelessly transmitted by the probes to the DUT (test of DUT receive mode).

If the DUT 1220 has integrated antenna arrays 1260, both on the top side and the bottom side of the package 1240, then two sets of probe adapters or pair-probes 1270 may be used, one for the top side and another for the bottom side.

A package level testing with single or multiple site with may use a probe and/or adapter integrated on the DUT socket, or a wafer probing level with single or multiple site with the probe and/or adapter optionally integrated on the probe head. Embodiments may also be used for non-ATE applications.

The ATE can include a tester, similar to tester 100 depicted in Fig. to provide a better signal-noise-ratio or a less expensive testing method.

Figure 13:
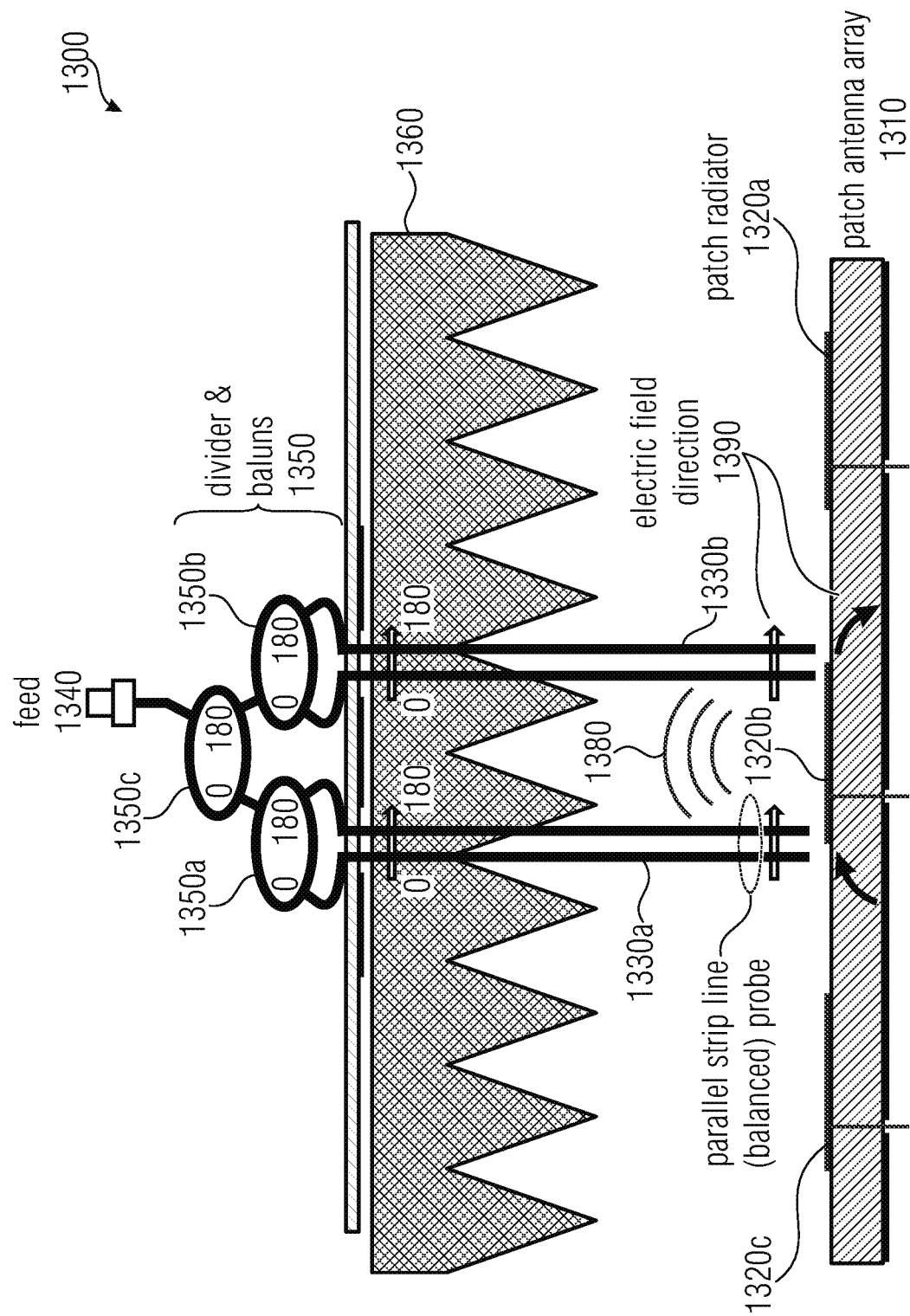
FIG. 13 is a diagram depicting an exemplary tester with two probe-pairs and an antenna array according to embodiments of the present invention.

FIG. 13 depicts an exemplary tester 1300 which may be similar to tester 100 depicted in FIG. 1 and a patch antenna array 1310 according to embodiments of the present invention. The patch antenna array 1310 includes patch antenna array elements or patch radiators 1320. The tester 1300 includes two needle-pair-probes 1330*a* and 1330*b* disposed in close proximity of the radiating edges of a patch radiator 1320*b*. The two needle-pair-probes 1330*a* and 1330*b* are parallel strip-line probes. The two needle-pair-probes 1330*a* and 1330*b* are connected through three baluns and/or dividers 1350*a-c* to the feed structure 1340. Between the patch antenna array 1310 and the dividers and/or baluns 1350*a-c* there is a layer of absorbers 1360.

In the example of FIG. 13, the directions of the electric fields 1390 are depicted. Vertical components are at opposite sides of a patch radiator 1320*b*, and horizontal components at the electric field have the same direction between the conductors of the first probe-pair 1330*a* and the conductors of the second probe-pair 1330*b*.

The patch radiator 1320 of a patch antenna array 1310 transmits a signal 1380 which is received by the two probe-pairs 1330*a* and 1330*b* of the tester 1300. The balanced currents of the conductors of the probe-pairs 1330 are combined using dividers and baluns 1350 in order to transition to an unbalanced feed line 1340.

Antenna array 1310 include three patch radiators 1320*a-c*, with the centered patch 1320*b* radiating and probed by two open-ended balanced two-wire transmission lines 1330*a* and 1330*b*. Most of the radiated energy enters the absorbers 1360. Signal-combining circuitry such as baluns and dividers 1350 can be placed on a board above the absorbers 1360.

At least one polarization of a patch radiator 1320 can be tested with a pair of parallel strip-probes, together with three hybrid combiners for the phase-correct signal distribution from the feed connector (e.g., when the parallel strip probes stimulate the DUT antenna) or for the correct signal combining (e.g., when the parallel strip probes receive a signal emitted from the DUT antenna). The absorbers 1360 are primarily used to avoid reflections from the circuit board carrying the hybrid-combiners circuitry.

According to embodiments, the centered radiator 1320*b* transmits a wave front 1380 in an upward direction. The patch has two radiating edges which act like slot radiators. The electric field at the radiating edges of the patch can be directed as shown by the arrows in the figure. A two-wire balanced transmission line (e.g., 1320*a* or 1320*b*) points towards the radiating edge of the patch. The open end of the line picks up a small fraction of the electromagnetic field and guides it as a guided wave in an upward direction towards the feed. Some distance is kept between the open end of the line and the patch metal. The probing transmission line is substantially perpendicular to the patch plane so that the electromagnetic fields of the radiated wave are perpendicular to the line in the far-field and thus will not be disturbed by the line. The radiated fields will be absorbed by the lossy absorber material depicted in the figure as pyramidal absorbers for clarity. In the near-field and close to the radiating edges of the patch, however, there may be disturbance and interaction, but their effects are negligible. The strength of coupling between patch radiator and probe may vary based on separation between the two wires of the line and on the distance between open end of the line and patch radiating edge. Above the absorber, the two-wire balanced line may be connected to baluns, dividers, and additional circuitry, such as switches, as needed.

Depending on the testing objectives one may put multiple of the needle pair elements or needle pair-probes 1330 either at each DUT antenna array element 1320 or may use a smaller number of needle pair-probes disposed at critical measurement points. The conductors of the needle pair-probes are then combined using high-frequency circuits and interconnects to the measurement instrumentation, such as using high-performance coaxial connectors.

Figure 14:
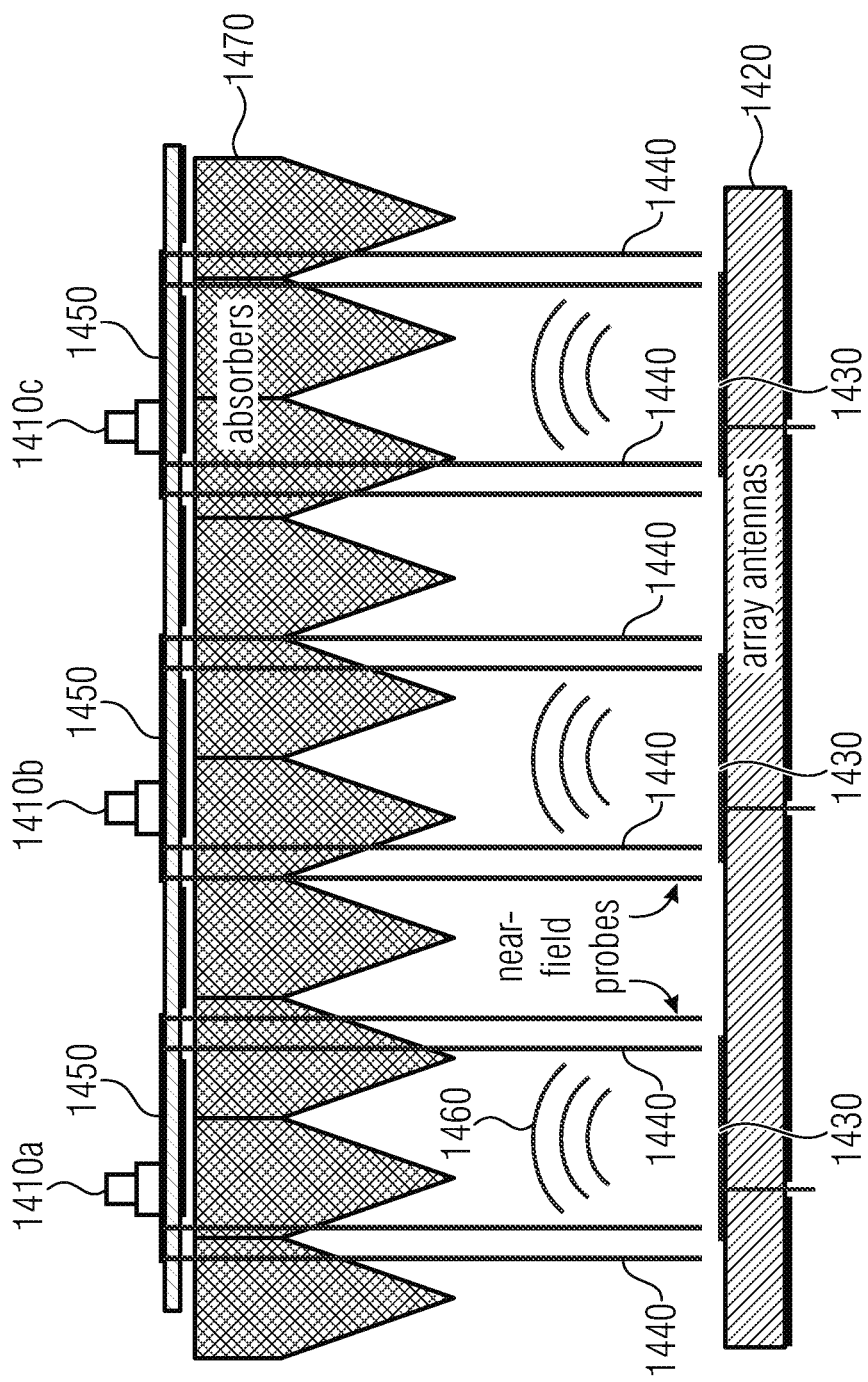
FIG. 14 is a diagram depicting a plurality of testers with two probe-pairs and an antenna array according to embodiments of the present invention.

FIG. 14 depicts exemplary testers 1410*a-c* and an antenna array 1420 including antenna array elements 1430 according to embodiments of the present invention. The testers 1410*a-c* are reaching into the reactive near-field of the antenna array elements 1430 of the antenna array 1420 and include two parallel needle-pair-probes 1440. The needle-pair-probes 1440 are coupled to the feed structures 1450.

The weakly coupled, non-contacting, pair-probes 1440 penetrate the reactive near-field of the antenna array elements or radiators 1430. The antenna elements 1430 of the antenna array 1420 emit signals 1460. A small fraction of the radiated energy 1460 is transmitted to the probe connectors, or feed structures 1450, which include a signal-combining circuitry in order to transition the signal from a balanced to an unbalanced line. Some of the energy radiated (1460) becomes absorbed by the absorbers 1470 disposed between the antenna array 1430 and the feed structures 1450. The coupling between the pair probes 1440 is so weak that the antenna array radiator 1430 impedance is not significantly affected.

According to some embodiments, the radiating element of the antenna array is probed with a transmission-line based structure in its reactive near-field in close proximity to the antenna array such that only the probed radiator element will couple to the probe and not to neighboring radiator elements. Neighboring elements may be tested in parallel to the first element with additional probes. The example of FIG. 14 depicts a linear array of three patch radiators, wherein a patch radiates from two slots at opposite ends of the patch, thus may be tested with two combined probes. All the three patches may be probed simultaneously. An absorber can be used to help to reduce unwanted reflections and couplings. In other words, tester 100 described by FIG. 1 may be extended to multiple probes, testing two or more sides of a dual-polarized patch, and/or testing several radiator elements at the same time. Depending on the testing objectives one may put multiple needle pair elements either at each DUT antenna array element or use a smaller number disposed at critical measurement points.

FIGS. 15*a-d* depicts an exemplary simulation setup 1500 with a dual-polarized patch antenna array 1550 including dual-polarized antenna elements 1540 and one or more parallel strip-line probes 1530 according to embodiments of the present invention.

FIG. 15*a* depicts a dual-polarized patch antenna array 1550 with a single parallel strip probe 1530 viewed from above according to embodiments of the present invention.

FIG. 15*b* depicts a dual-polarized patch antenna array 1550 with a single parallel strip probe 1530 viewed as a cross sectional cut according to embodiments of the present invention.

FIG. 15*c* depicts a dual-polarized patch antenna array 1550 with four parallel strip probe 1530 for testing two antenna elements viewed from above according to embodiments of the present invention.

FIG. 15*d* depicts a dual-polarized patch antenna array 1550 with four parallel strip probe 1530 for testing two antenna elements viewed as a cross sectional cut according to embodiments of the present invention.

In the examples of FIGS. 15*a-d*, an exemplary test simulation 1500 for testing a patch radiator 1540 with one or more parallel strip probes is described. According to the test results, the coupling from the radiator feed connector to the probe port is about −19 dB, and the largest coupling from any other radiator feed is about 9 dB smaller.

FIG. 16*a* and FIG. 16*b* show an exemplary simulation setup 1600 with a periodic 2D dual-polarized patch antenna array 1610 including dual-polarized antenna elements 1620 and a parallel strip-line probe 1630 according to embodiments of the present invention. FIG. 16*a* and FIG. 16*b* show the dimensions in relation to the free-space wavelength, $\lambda_0$. The $\lambda_0$ used in a 6 GHz prototype is typically 50 mm.

FIG. 16*a* shows a top view of a periodic 2D dual-polarized patch antenna array 1610 with a single parallel strip-line probe 1630 according to embodiments of the present invention. A period of the patch antenna array 1610 or center-to-center distance between two antenna elements 1620, is $0.5 \times \lambda_0$.

FIG. 16*b* shows a side view of the periodic 2D dual-polarized patch antenna array 1610 with the single parallel strip-line probe 1630. The single parallel strip-line probe 1630 includes two conductor strips with a strip-width of $0.02 \times \lambda_0$ and a $0.02 \times \lambda_0$ gap between them (for example, with a tolerance of ±50%). The single parallel strip-line probe 1630 is placed in distance of $0.01 \times \lambda_0$ from the antenna array 1610 (for example, with a tolerance of ±50%).

Layers of the periodic 2D dual-polarized patch antenna array 1610, from the probe side are listed below:
- a square copper patch, with the size of $0.24\lambda_0 \times 0.24\lambda_0$;
- a patch dielectric layer, with a thickness of $0.24 \times \lambda_0$ (or $0.03 \times \chi_0$);
- a patch copper ground layer;
- a feed circuit dielectric layer;
- a patch copper feed line, shown on FIG. 16, feeding the square copper patch.

Exemplary simulation setup 1600 can be use with a tester (e.g., tester 100 of FIG. 1) for a 6 GHz prototype antenna array. Dimensions are given in relation to the free-space wavelength, $\lambda_0$, thus allowing an easy rescaling for antenna array with other frequencies. However, in some embodiments, deviation from the given sizes up to a factor of two (or even more) may be allowed.

Figure 17:
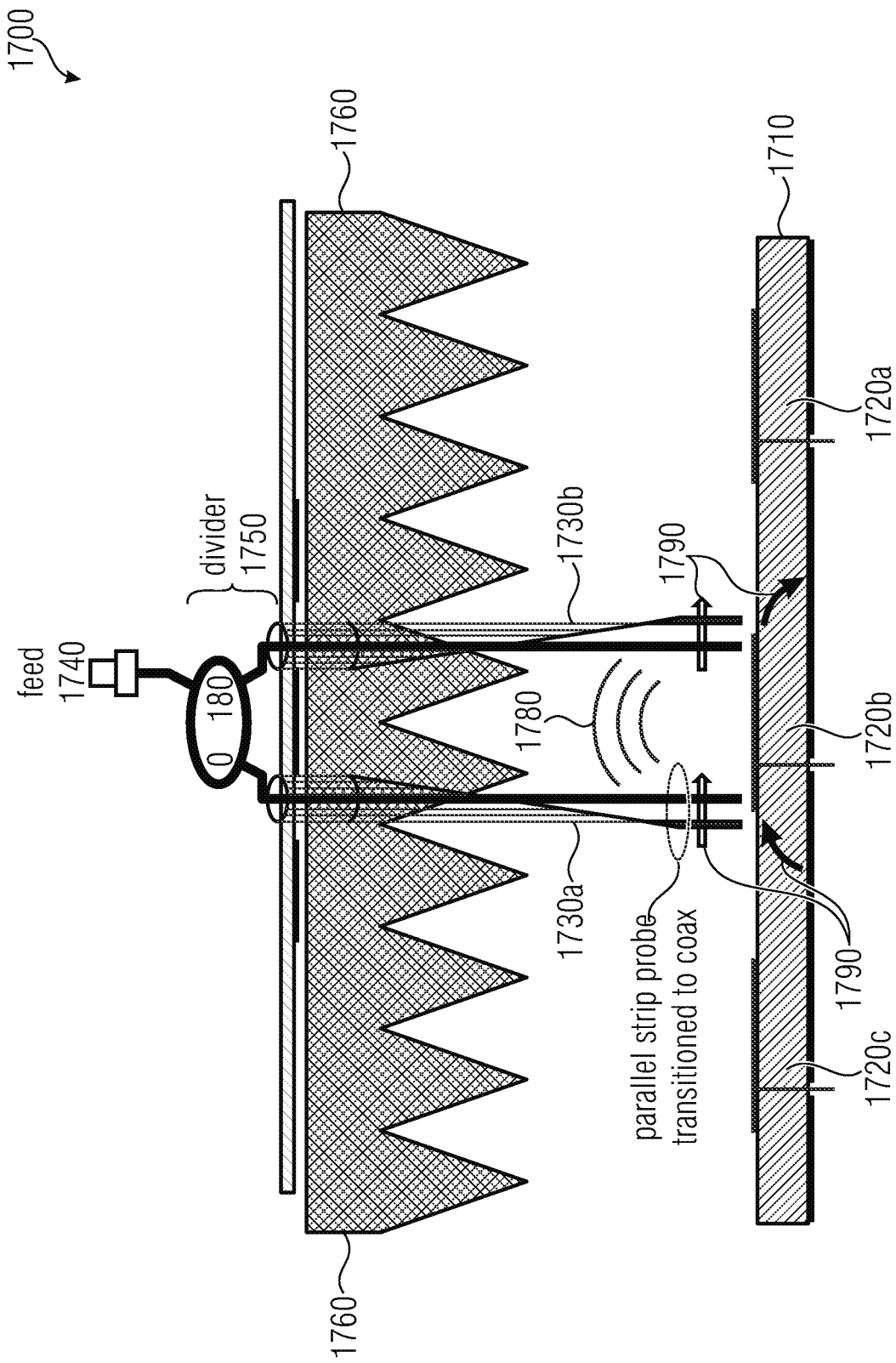
FIG. 17 is a diagram of an exemplary tester and a patch antenna array with two parallel strip-probes transitioning smoothly to a coax-line according to embodiments of the present invention.

FIG. 17 depicts an exemplary tester 1700 and a patch antenna array 1710 according to embodiments of the present invention. The patch antenna array 1710 includes patch antenna array elements or patch radiators 1720*a-c*. The tester 1700 includes two parallel strip-probes 1730*a* and 1730*b* disposed in close proximity of the radiating edges of a patch radiator 1720*b*. The two parallel strip-probes 1730*a* and 1730*b* are transitioning smoothly to a coax-line. The two parallel strip-probes 1730*a* and 1730*b* are connected through a divider 1750 to the feed structure 1740. Between the patch antenna array 1710 and the divider 1750 is a layer of absorbers 1760, and the coax lines are fed through the absorber.

FIG. 17 also shows the directions of the electric fields 1790 which are at opposite sides of a patch radiator 1720. The horizontal component of the electric field run in the same direction between the conductors of the first parallel strip-probe 1730*a* and the conductors of the second parallel strip-probe 1730*b*.

The patch radiator 1720*b* of a patch antenna array 1710 is transmitting a signal 1780 which is received by the two parallel strip-probe 1730*a* and 1730*b* transitioning smoothly to coax-lines, of the tester 1700. The balanced currents of the conductors of the parallel strip-probe 1730 are combined, using a divider 1750 in order to transition to an unbalanced feed line 1740.

The design example can be operated such that the wirelessly transmitted signal by the DUT is probed and is then accessible at the feed 1740 (test of DUT transmit mode). Alternatively, a signal injected in the feed 1740 can be wirelessly transmitted by the probes to the DUT antenna 1720*b* to test the receive mode of the DUT.

In the example of FIG. 17, patch radiator 1720 is tested with a pair of parallel strip probes 1730 that transitions smoothly to a coax-line using a single 180-degrees-hybrid or a divider 1750 required for signal combining. For example, a first strip of the parallel strips transmissions smoothly into an outer shield of the coax line, while a second strip of the parallel strips forms an inner conductor of the coax line. For example, the outer shield of the coax line opens more and more in a direction from the feed structure towards the open end of the probe.

At least one polarization of a patch radiator 1720 is tested with a pair of parallel strip probes 1730, transitioning smoothly to coax line. Thus, the balun property is part of the probe tip. Therefore, only one hybrid combiner or divider 1750 is required for signal distribution from the feed connector 1740. There is, possible significant, in-phase or unbalanced current along the probe tip, therefore there is, in some cases, a need for absorbers 1760 also to reduce possible monopole-like radiation from the probe tip. In addition, the absorbers 1760 are also needed, in some cases, to avoid reflections from the circuit board carrying the hybrid combined circuitry.

Figure 18A:
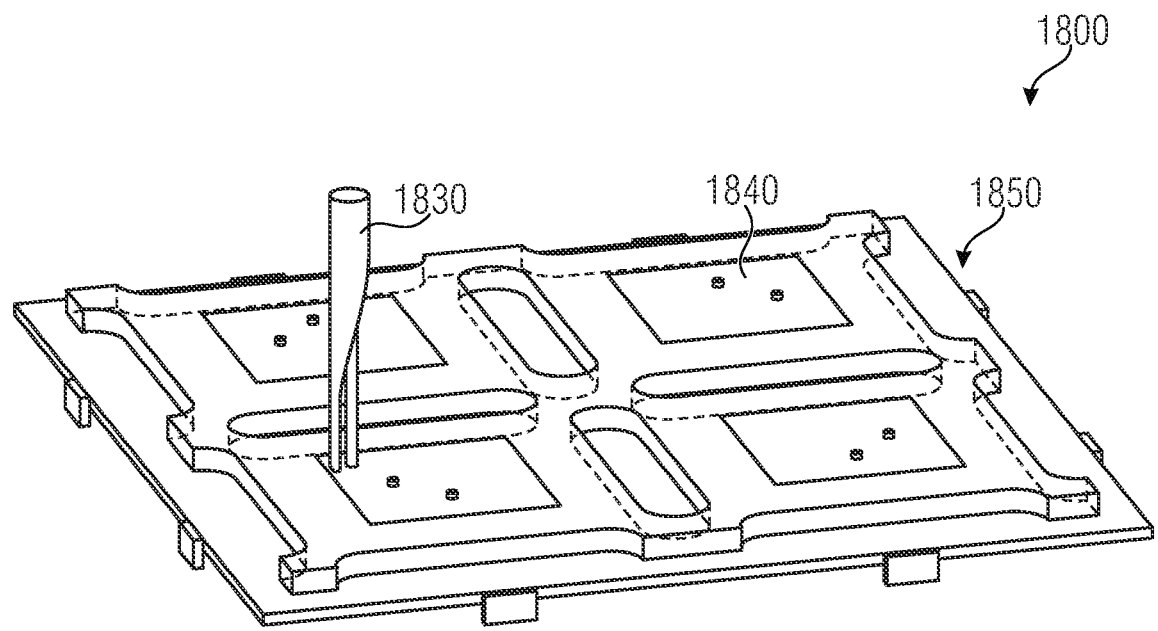
FIG. 18a is a diagram of an exemplary test simulation with a dual-polarized patch antenna array and a parallel strip-line probe that transitions to a coax-line according to embodiments of the present invention.
Figure 18B:
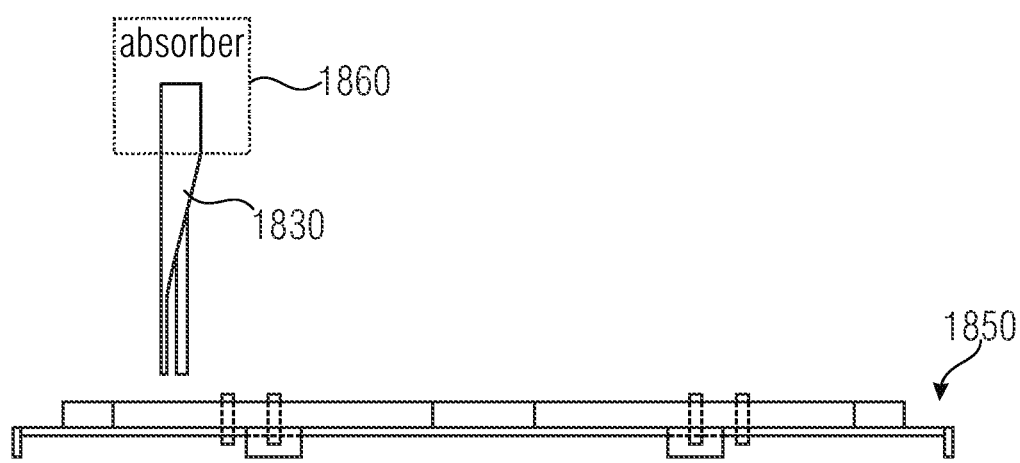
FIG. 18b is a diagram of an exemplary test simulation with a dual-polarized patch antenna array, a parallel strip-line probe that transitions to a coax-line, and absorber layer, according to embodiments of the present invention.

FIG. 18*a* and FIG. 18*b* depict an exemplary simulation setup 1800 including a dual-polarized patch antenna array 1850 having dual-polarized antenna elements 1840 and a parallel strip-line probe 1830 that transitions to a coax-line according to embodiments of the present invention.

FIG. 18*a* shows a perspective view of a dual-polarized patch antenna array 1850 with a single parallel strip-line probe 1830 that transitions to a coax-line according to embodiments of the present invention.

FIG. 18*b* shows a side view of a dual-polarized patch antenna array 1850 with a single parallel strip-line probe 1830 that transitions to a coax-line and absorber layer 1860 according to embodiments of the present invention.

FIG. 18*a* and FIG. 18*b* show an exemplary simulation setup for testing a patch radiator with dual-polarized patch antenna array and with a parallel strip probe that transitions smoothly to coax line. Absorber material is can be used to suppress resonances on the coax outer conductor to prevent monopole-like radiation and strong coupling to neighboring radiator elements.

FIG. 18*a* depicts an exemplary test simulation 1800 for testing a patch radiator 1840 with a parallel strip probe that transitions smoothly to coax line according to embodiments of the present invention. According to embodiments, the coupling from the radiator feed connector to the probe port is about −19 dB, and the largest coupling from any other radiator feed is more than 10 dB smaller.

Figure 19:
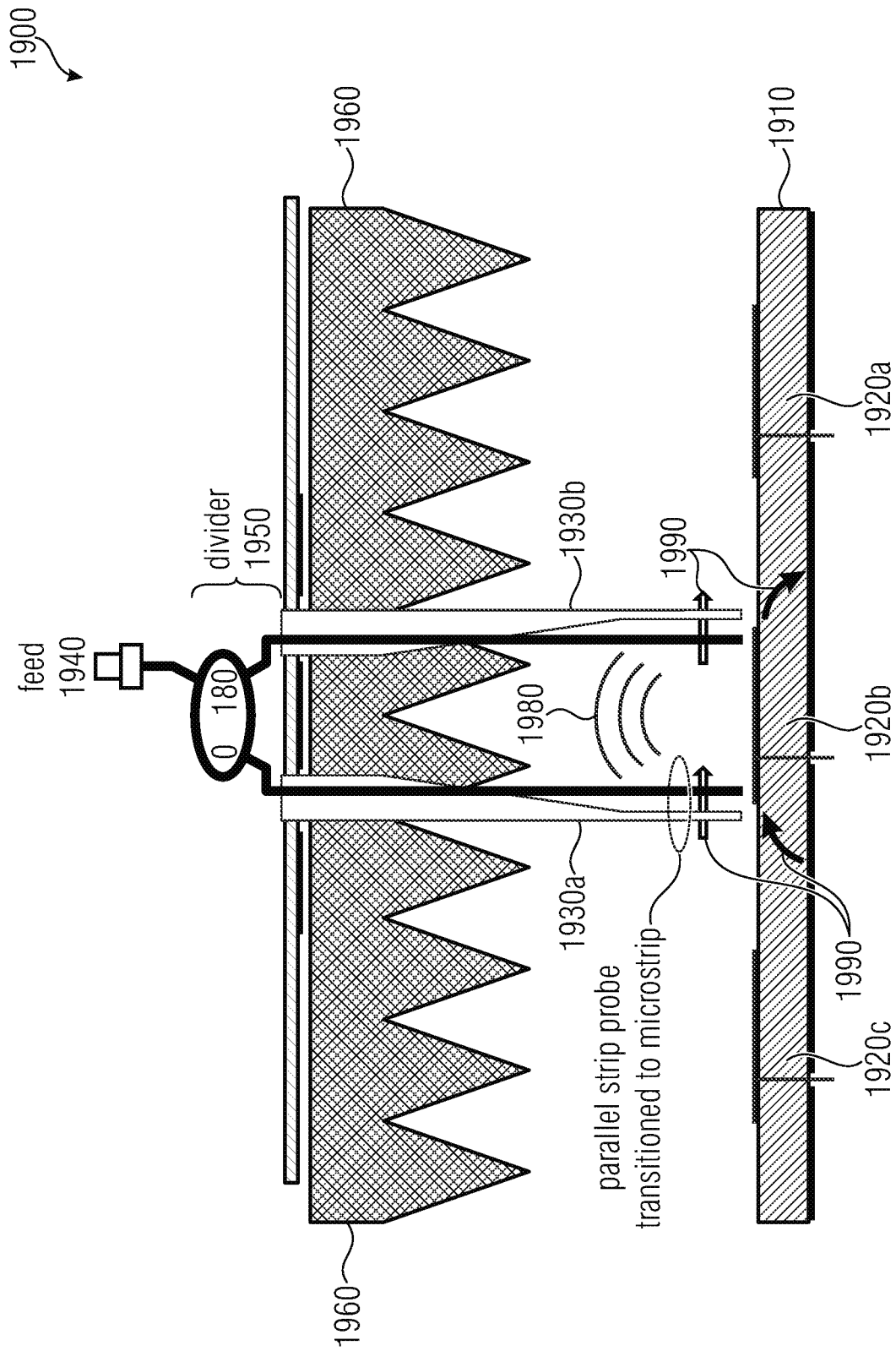
FIG. 19 is a diagram of an exemplary tester and a patch antenna array with two parallel strip-probes are transitioning smoothly to a micro-strip-line according to embodiments of the present invention.

FIG. 19 depicts an exemplary tester 1900 which may be similar to the tester 100 on FIG. 1 and a patch antenna array 1910 according to embodiments of the present invention. The patch antenna array 1910 includes patch antenna array elements or patch radiators 1920*a-c*. Tester 1900 includes two parallel strip-probes 1930*a* and 1930*b* disposed in close proximity of the radiating edges of a patch radiator 1920*b*. The two parallel strip-probes 1930*a* and 1930*b* transition smoothly to a micro-strip-line. The two parallel strip-probes 1930*a* and 1930*b* are connected through a divider 1950 to the feed structure 1940. Between the patch antenna array 1910 and the divider 1950, there is a layer of absorbers 1960.

In the example of FIG. 19 the directions of the electric fields 1990 are substantially opposite at the opposite sides of a patch radiator 1920 and the horizontal component of the electric field runs in the same direction between the conductors of the first parallel strip-probe 1930*a* and the conductors of the second parallel strip-probe 1930*b*.

The patch radiator 1920 of a patch antenna array 1910 is transmitting a signal 1980 that is received by the two parallel strip-probes 1930*a* and 1930*b* that transition smoothly to micro-strip-lines of the tester 1900. The balanced currents of the conductors of the parallel strip-probes 1930*a* and 1930*b*, are combined using a divider 1950 in order to transition to an unbalanced feed line 1940.

In the example of FIG. 19, patch radiator 1920*b* with a pair of parallel strip probes 1930*a* and 1930*b* uses a single 180-degrees-hybrid or a divider 1950 for signal combining. At least one polarization of a patch radiator 1920*b* is tested with a pair of parallel strip probes 1930, transitioning smoothly to micro-strip-lines and the balun property is part of the probe tip. Therefore, only one hybrid combiner or divider 1950 is used for signal distribution from the feed connector 1940. Absorbers 1960 reduce possible monopole-like radiation from the probe tip. In addition, the absorbers 1960 can be used to avoid reflections from the circuit board carrying the hybrid combined circuitry.

Figure 20A:
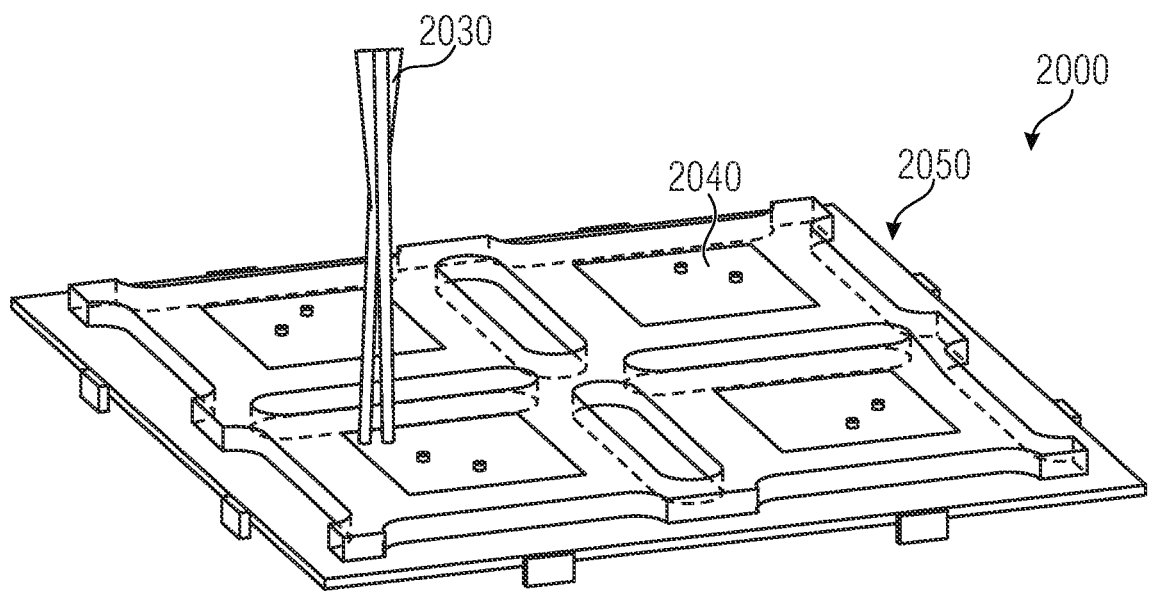
FIG. 20a is a diagram of an exemplary test simulation with a dual-polarized patch antenna array and a parallel strip-line probe that transitions to a micro-strip-line according to embodiments of the present invention.
Figure 20B:
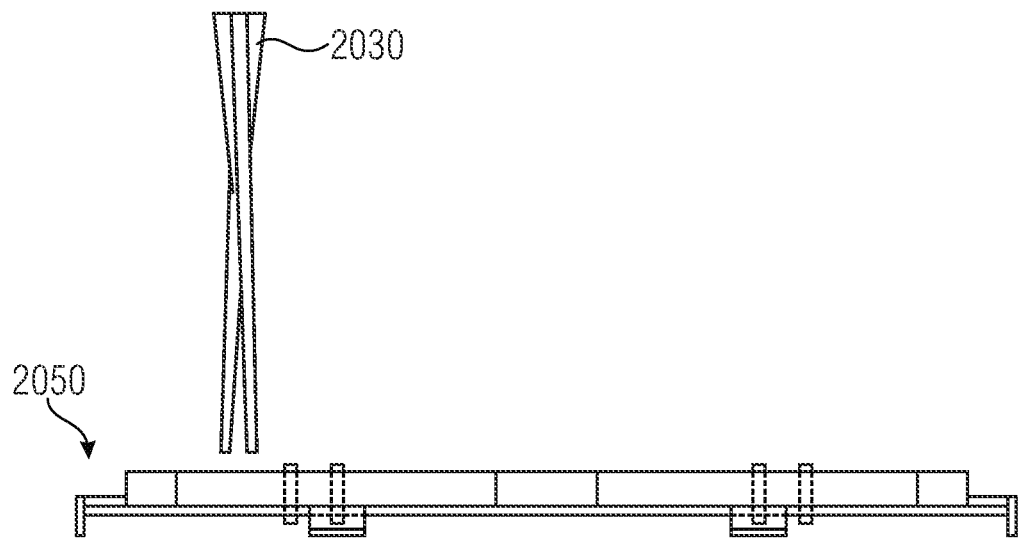
FIG. 20b is a diagram of an exemplary test simulation with a dual-polarized patch antenna array and a parallel strip-line probe that transitions to a micro-strip-line according to embodiments of the present invention.

FIG. 20*a* and FIG. 20*b* depict an exemplary test simulation 2000 with a dual-polarized patch antenna array 2050 including dual-polarized antenna elements 2040 and a parallel strip-line probe 2030 that transitions to a micro-strip-line according to embodiments of the present invention.

FIG. 20*a* shows a top view of a dual-polarized patch antenna array 2050 with a single parallel strip-line probe 2030 that transitions to a micro-strip-line according to embodiments of the present invention.

FIG. 20*b* shows a side view of a dual-polarized patch antenna array 2050 with a single parallel strip-line probe 2030 that transitions to a micro-strip-line according to embodiments of the present invention. A ground conductor of the micro-strip-probe narrows towards a tip of the parallel-strip probe. A center conductor of the micro-strip line continuously solves in a lateral direction, from the ground conductor towards the parallel strip-probe. Accordingly, an overlap (e.g., in projection perpendicular to a surface of a circuit board carrying the micro-strip line) of the ground conductor and of the center conductor deviates steadily since a dilation into which the center conductor extends deviates slightly (e.g., by 5 to 20 degrees) from a direction into which the narrowing ground conductor extends. Towards the tip of the parallel strip probe, the ground conductor and the center conductor transitioned to separate, non-overlapping conductors.

FIG. 20*a* and FIG. 20*b* depict examples of testing a patch radiator with a parallel strip probe, transitioning smoothly to a micro-strip-line. The coupling from the radiator feed connector to the probe port is about −20 dB, and the largest coupling from any other radiator feed is about 8 dB smaller.

Figure 21:
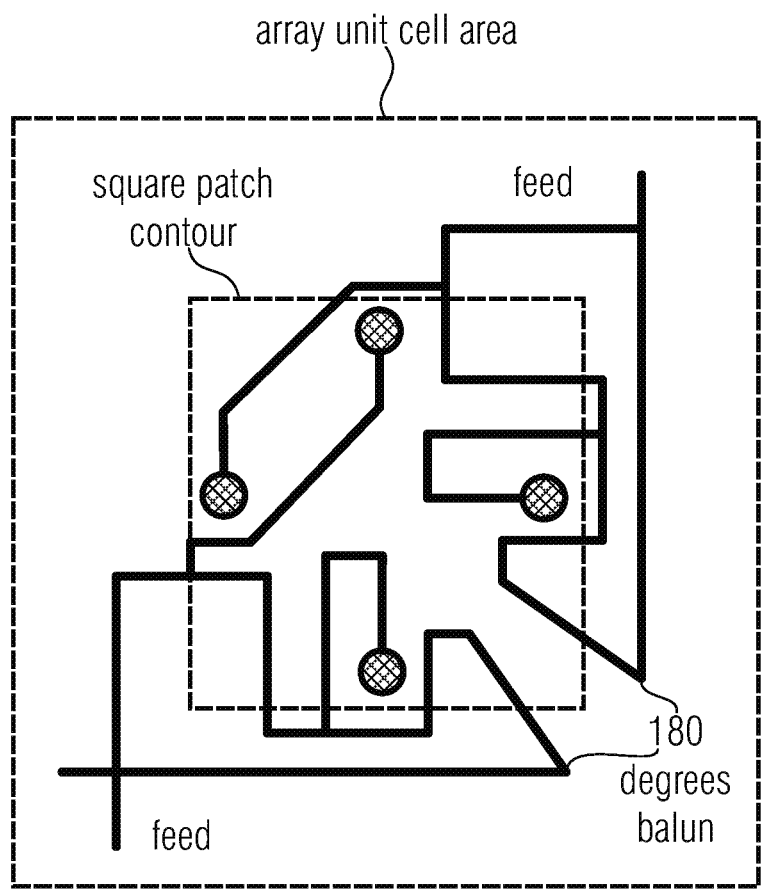
FIG. 21 is a diagram of an exemplary 180-degrees hybrid in a strip-line circuit according to embodiments of the present invention.

FIG. 21 depicts an exemplary 180-degrees hybrid in a strip-line circuit that covers an area smaller than a crossed dipole or a dual-polarized patch according to embodiments of the present invention. The distribution circuit may include dividers and/or baluns for each polarization of each antenna radiator element, and two dividers and/or baluns per area of a dual-polarized radiator antenna element may be used according to some embodiments. This can be achieved in a single strip-line circuit layer, as depicted in FIG. 21.

The routing from the feed connector, for example a waveguide or a coax connector, can pass through switches to the antenna radiator ports on a separate strip-line or microstrip layer. Accordingly, a multilayer circuit with a minimum of three dielectric layers and four conductor layers can be used. The balanced currents on the probe (e.g., the probe of tester 100 on FIG. 1) are combined to transition to an unbalanced line, for example a microstrip line or a strip line, using one or more balun circuit and/or 180° hybrid. A balun circuit converts between a balanced signal and an unbalanced signal and helps interface the probe antenna with the feed line, such as a coax line.

Figure 22:
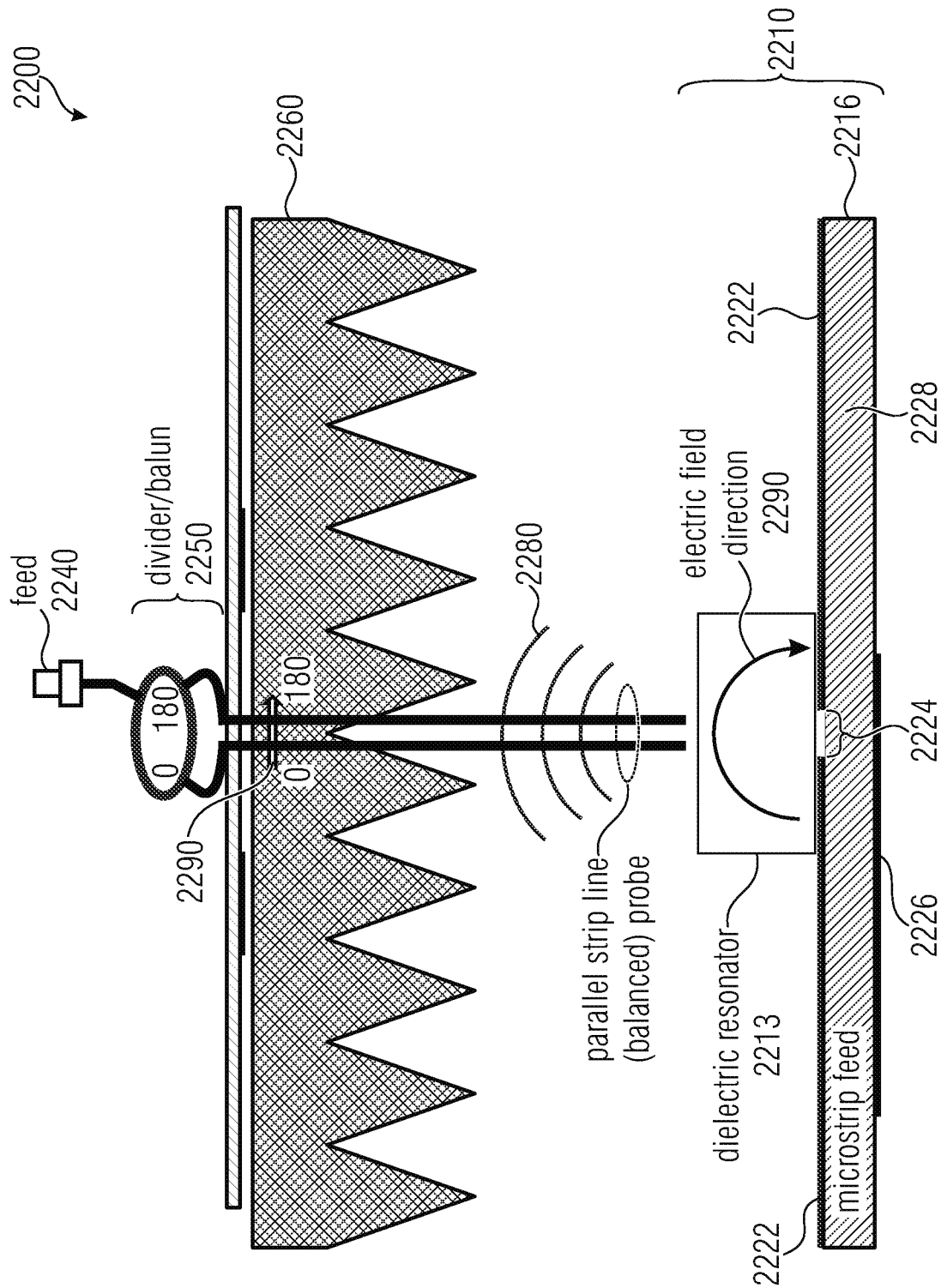
FIG. 22 is a diagram of an exemplary tester and a dielectric resonator antenna according to embodiments of the present invention.

FIG. 22 depicts an exemplary tester 2200 (similar to the tester 100 on FIG. 1) and a dielectric resonator antenna 2210 according to embodiments of the present invention. The dielectric resonator antenna 2210 includes a dielectric resonator 2213 and a microstrip feed 2216. The microstrip feed 2216 includes a ground plane 2222 with an opening 2224, an antenna feed-line 2226 and a substrate 2228. The ground plane 2222 is separated from the antenna feed-line 2226 by the substrate 2228. The dielectric resonator 2213 is disposed on the ground plane 2222 with the opening 2224 of the ground plane 2222 between the center of the dielectric resonator 2213 and the substrate 2228 and between the center of the dielectric resonator 2213 and the antenna feed-line 2226. The tester 2200 includes a balanced parallel strip-probe 2230 disposed in close proximity to the dielectric resonator 2213 in the center-line of the dielectric resonator 2213. The two conductors of the parallel strip-probe 2230 are connected through a divider or a balun 2250 to the feed structure 2240. A layer of absorbers 2260 is disposed between the dielectric resonator antenna 2210 and the balun or divider 2250. FIG. 22 also depicts the directions of the electric fields 2290.

The dielectric resonator antenna 2210 transmits a signal 2280 that is received by the parallel strip-probe 2230 of the tester 2200. The balanced currents of the conductors of the parallel strip-probe 2230 are combined using a divider 2250 that transitions to an unbalanced feed line 2240.

Figure 23:
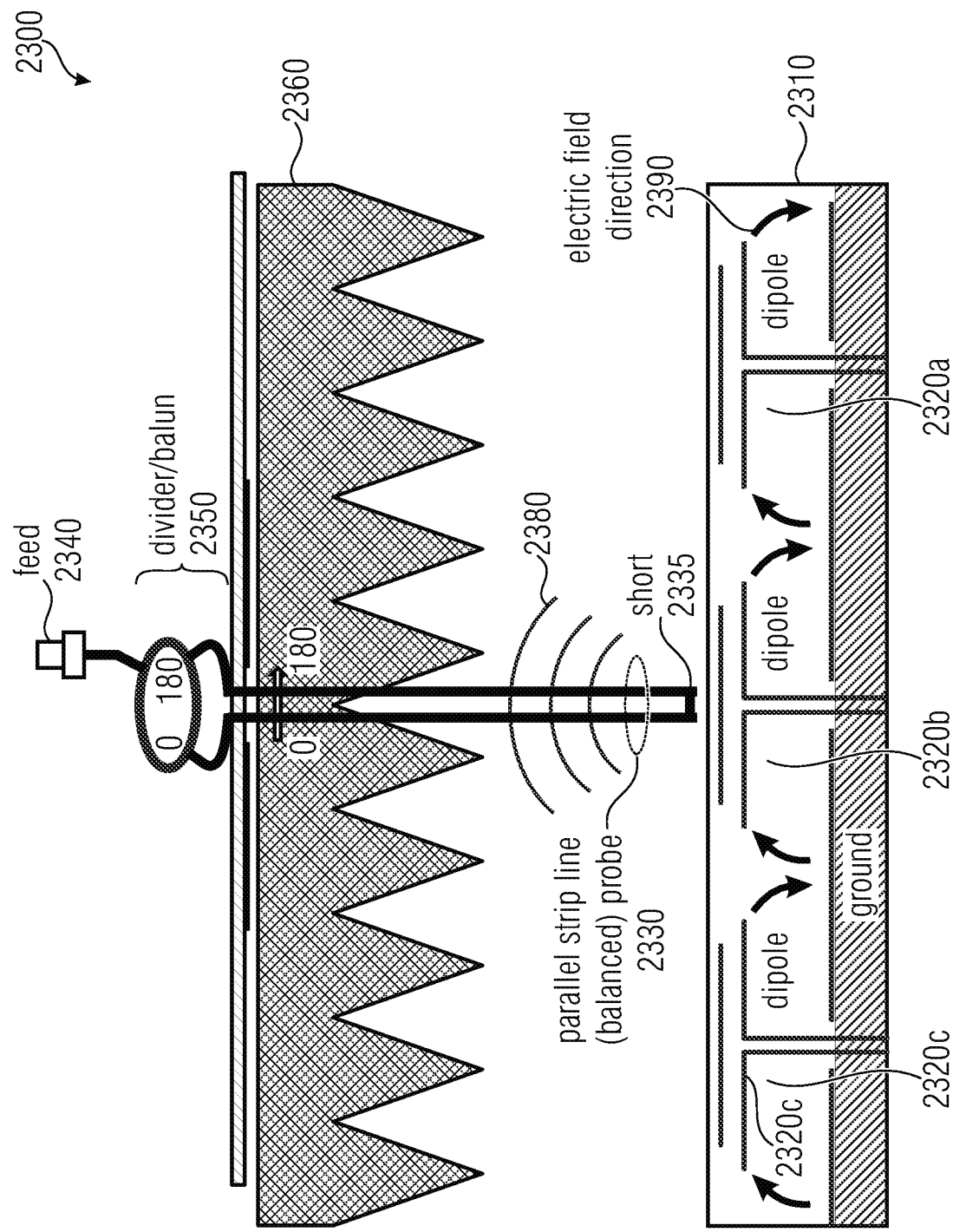
FIG. 23 is a diagram of an exemplary tester with a closed-loop probe-end and a dipole antenna array according to embodiments of the present invention.

FIG. 23 depicts an exemplary tester having a dipole antenna array 2310 with dipole antenna array elements 2320a-c according to embodiments of the present invention. The tester 2300 includes a parallel strip-probe 2330, and the two conductors of the probe 2330 are connected at the ends with a conducting strip 2335 to form a closed loop. The closed loop of the parallel strip-probe is disposed in a proximity of a dipole antenna element 2320b in close proximity to the symmetry plane of the dipole antenna element 2320. The parallel strip-probe 2330 is connected through a balun or a divider 2350 to the feed structure 2340. Between the dipole antenna array 2310 and the divider 2350 there is a layer of absorbers 2360. FIG. 23 also depicts the direction of the electric fields 2390 between the ground and opposite ends of the dipole antenna element 2320.

A dipole antenna element 2320b of the dipole antenna array 2310 transmits signal 2380. The magnetic field produced in the nearfield region of the dipole penetrates the closed loop formed by the parallel-strip-probe 2330 and the conductive strip 2335 and induces a signal that is guided towards the feed 2340. The currents of the conductors of the parallel strip-probe 2330 are combined using a balun or a divider 2350 in order to transition to an unbalanced feed line 2340. In the example of FIG. 23, shorted parallel strip probe 2330 senses the magnetic field and single 180-degrees-hybrid 2350 is used to combine the signal. The probe with conductive short or strip 2335 can be used for weakly probing of the magnetic field in the center symmetry-plane of the dipole-like antenna array element 2330.

Antenna array 2310 includes three on-board dipole radiators 2320a-c, with the centered dipole radiating and probed by a short-circuited end 2335 of a balanced two-wire transmission line 2330. Most of the radiated energy 2380 enters the absorbers 2360. Signal-combining circuitry such as a balun 2350 can be placed on a board behind the absorbers 2360. A linear array of on-board end-fire dipole antennas 2320a-c can be probed as depicted in the example of FIG. 23. The two-wire balanced transmission line 2330 of the probe is placed in the electric symmetry plane of the dipole antenna. In this way, the dipole is not affected by the metal structure entering its reactive near-field region. A fraction of the strong magnetic field surrounding the center part of the dipole antenna 2320 is coupled to the two-wire transmission line 2330 through shorted end 2335. Coupling from neighboring dipole radiators is very small; therefore, several probes can be placed in parallel and probe each dipole separately.

According to some embodiments, tester 100 on FIG. 1 can be modified by shorting the ends of the two conductors, in order to probe the magnetic field of the antenna element. FIG. 23 shows one embodiment having a dipole antenna and a shorted parallel strip line probe sensing the magnetic field. The coupling from the radiator feed connector to the probe port is about −19 dB, and the coupling from the neighboring dipole is about 15 dB smaller.

FIGS. 24a-c depict an exemplary test simulation 2400 for testing a dipole radiator 2440a of a dipole antenna array 2450 with a shorted parallel strip H-field probe 2430 according to embodiments of the present invention.

FIG. 24a depicts a geometrical view of an antenna array 2450 which includes three dipole antennas 2440a-c and a shorted parallel strip probe 2430 positioned in the near-field region of a dipole antenna element along a main extension perpendicular to the plane of the antenna array 2450 according to embodiments of the present invention.

FIG. 24b depicts a side view of the same simulation setup 2400 according to embodiments of the present invention. The orthogonal orientation of the antenna array 2450 and the probe 2430 is pointed out here.

FIG. 24c depicts an E-field magnitude plot of the simulation setup 2400 while feeding and probing the upmost dipole according to embodiments of the present invention. The coupling from the radiator feed connector to the probe port is about −19 dB, and the coupling from the neighboring dipole is about 15 dB smaller.

Figure 25B:
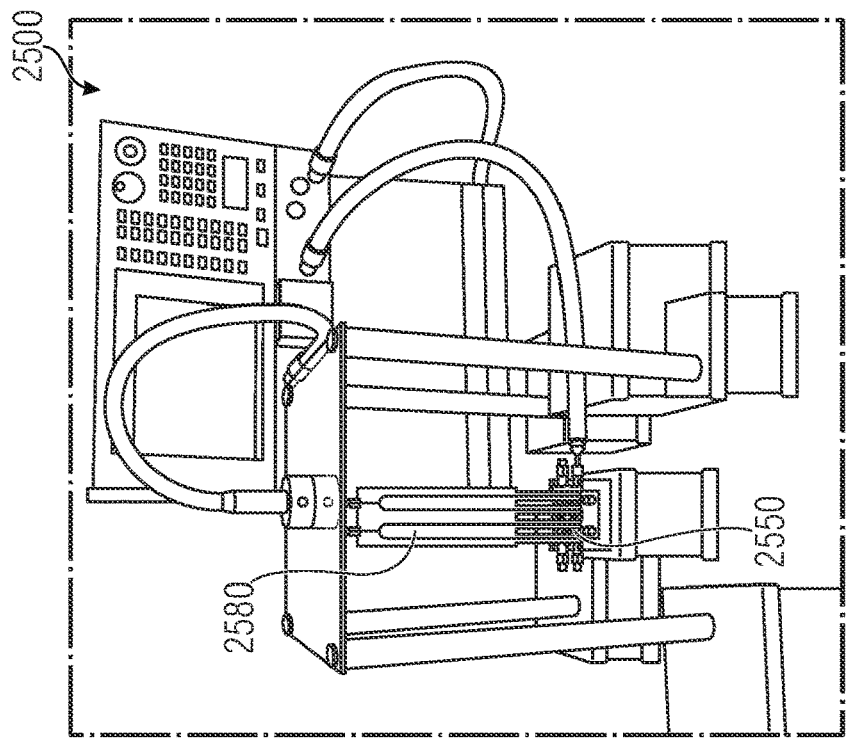
FIG. 25b is a diagram of an exemplary test measurement using the patch antenna array shown in FIG. 25a according to embodiments of the present invention.
Figure 25A:
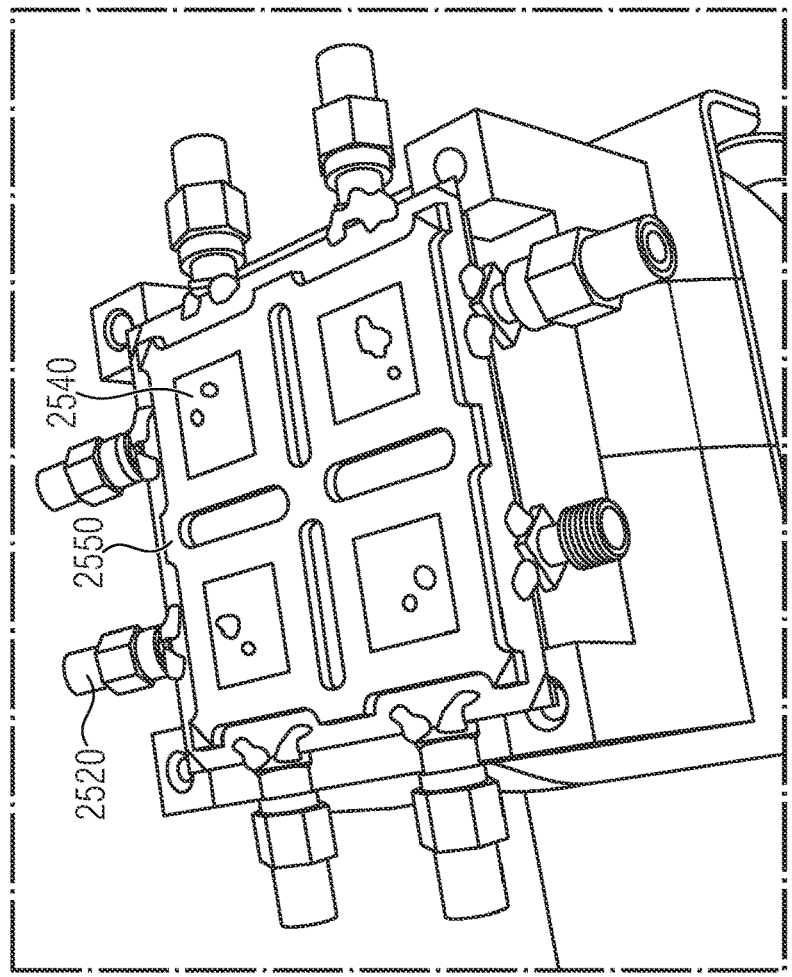
FIG. 25a is a diagram of an exemplary patch antenna array according to embodiments of the present invention.

FIG. 25a and FIG. 25b depict proof-of-concept experimental validation for a dual-linear polarized patch antenna array 2550 according to embodiments of the present invention.

FIG. 25a depicts dual-linear polarized patch antenna array 2550 with four dual-polarized radiators 2540 and 8 feed-lines 2520 designed for or operating at 5.85 GHz according to embodiments of the present invention. Dual-linear polarized patch antennas 2540 have direct feeds 2520 through the ground plane. The antenna uses 60 mil RO4003 dielectric ($\varepsilon_{rel}$=3.55) material and the spacing of the antenna array elements, or the center-to-center distance, is 25 mm, or 0.49 wavelengths, for example. The results of the measurements of the eight antenna feeds show some variation due to manufacture tolerances, such as, for example, a center frequency variation of ±0.1%. The patch impedance bandwidth at −10 dB is about 2.1%.

FIG. 25b depicts an experimental measurement setup with the antenna array 2550 and a 4-probe system 2580 having dual-strip probes tapered to a micro-strip-line according to embodiments of the present invention.

Frequency-scaled experimental test configuration 2500 is designed and measured to illustrate the following key aspects or advantages of the proposed technique:
  Defined coupling from radiator element to probe. Coupling magnitude of roughly −20 dB;
  The probe does not significantly affect the feed impedance of the probed radiator element. A sensitive (narrowband) patch antenna is used;
  Neighboring radiator elements do not significantly couple to the probe. The measured coupling shall be significantly smaller than the coupling from the probed element.

Figure 26A:
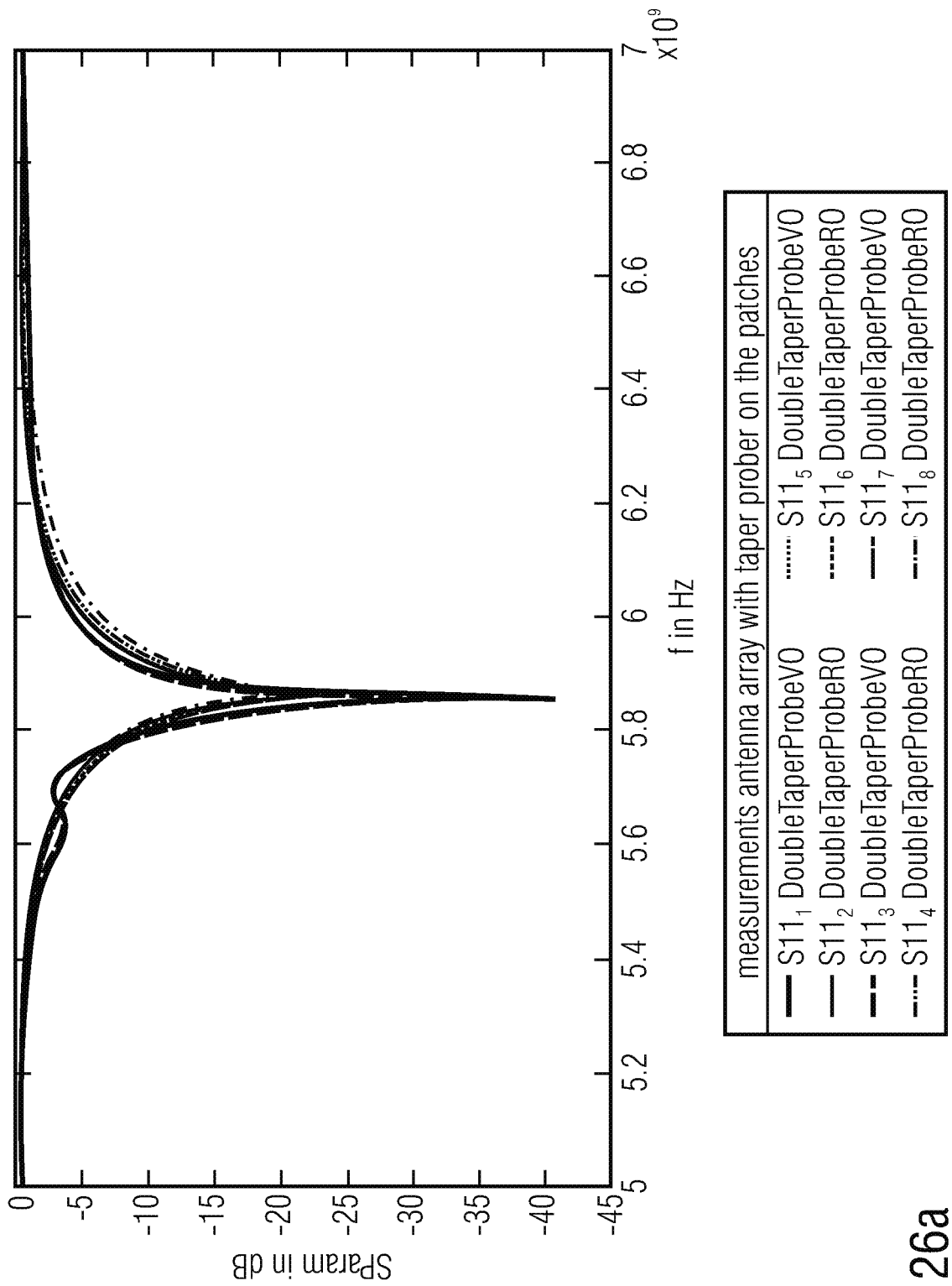
FIG. 26a is a diagram of exemplary results of the experiment described in FIG. 25 according to embodiments of the present invention.
Figure 26B:
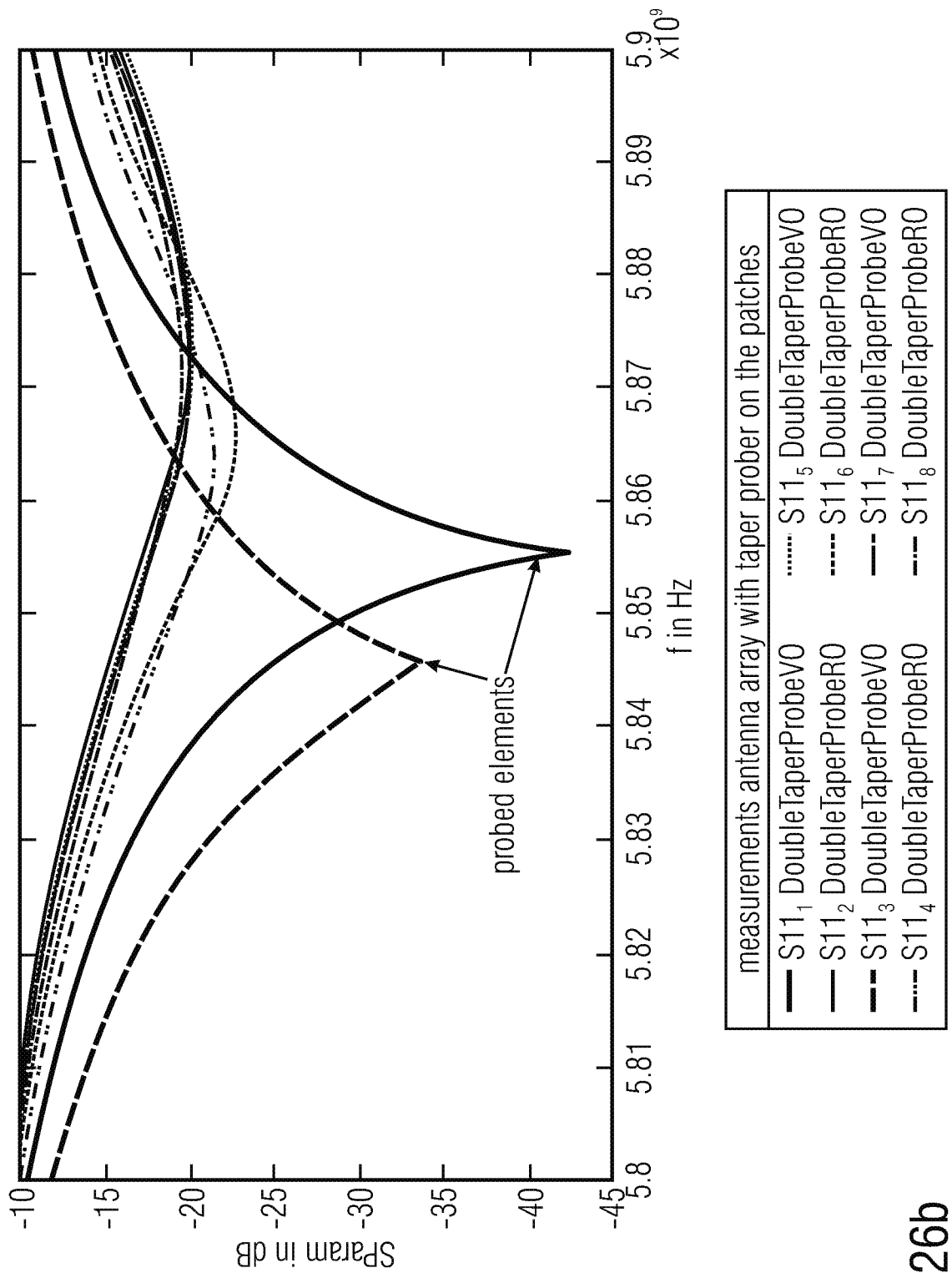
FIG. 26b is a diagram of an exemplary of the results of the experiment described in FIG. 25 from a close perspective according to embodiments of the present invention.

FIG. 26a and FIG. 26b depict exemplary results of the experiment described in FIG. 25a and FIG. 25b according to embodiments of the present invention. The input feed reflection coefficient magnitudes of the 8 feeds of the four dual-mode patch antennas are presented on a diagram. Two feeds are probed, as described in FIG. 25a and FIG. 25b, and cause detuning of the antenna feed impedance resonance of about 0.3%-0.4%, while the −10 dB bandwidth of this patch radiator is larger than 2%.

In one example, the antenna array with 4 dual-polarized patch antennas provides 8 feed ports (numbered 1 ... 8) and a probe pair is attached to patch feed port number 1. Another probe pair is attached to patch feed port number 3 (as shown in FIG. 25b). The magnitudes of the 8 feed port input reflection coefficient, denoted as S11 in FIG. 26a and FIG. 26b, are small at the antenna operation frequency of about 5.85 GHz (FIG. 26a). The closeup of this measurement (FIG. 26b) shows six almost identical measurements related to the feed ports of the patches and polarizations which are not probed (exhibiting small variations due to manufacturing inaccuracies). It also shows two measurements marked as "probed elements" which are the input reflection coefficient magnitudes of the two patches/polarizations with probes attached (as shown in the experimental setup in FIG. 25b). The feed port numbering in the legends of the graphs is detailed in FIG. 28.

Figure 27A:
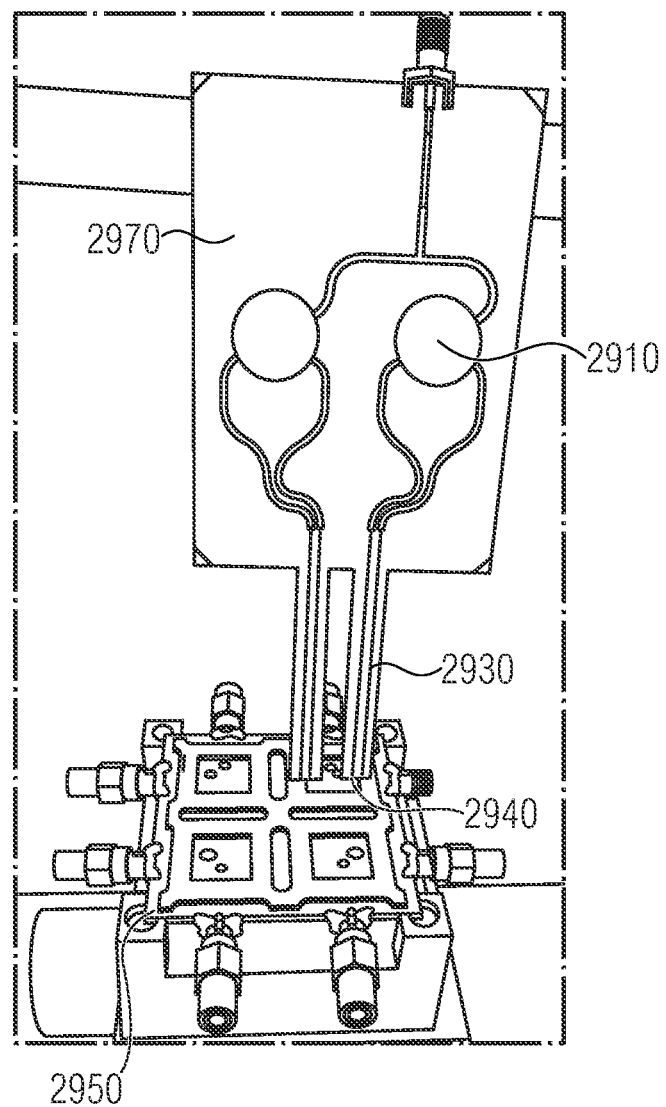
FIG. 27a is a diagram of an exemplary proof-of-concept test measurement with an antenna array according to embodiments of the present invention.

FIG. 27a depicts an exemplary antenna array 2950 with one antenna element 2940 probed using a pair of dual-strip line probe 2930 according to embodiments of the present invention. Patch antenna array 2950 is tested using a balanced two-wire transmission-line probe 2930 at a frequency of 5.85 GHz, for example. Narrowband patch antennas are used because of their high sensitivity to disturbances of their reactive near-field. As depicted in FIG. 27a, a pair of two-wire balanced transmission-lines probe 293 test a particular polarization of a patch antenna array element 2940. Two rat-race baluns 2910 and an in-phase combiner are part of the probe board 2970.

FIG. 27a shows an exemplary measurement setup having one patch antenna element probed in one polarization with a pair of two-wire transmission-lines according to embodiments of the present invention. The probe structure can be made deliberately bulky, particularly the width and the separation of the metal strips of the two-wire line and the thickness of their supporting dielectric substrate, such that a scaling to higher frequency and/or smaller size, e.g., 60 GHz, is straightforwardly feasible. By the application of the probe to the patch antenna, the impedance bandwidth shifts towards a lower frequency by less than 0.3%, well within the bandwidth of the given antenna. Results of this experimental verification is shown on the diagram 2920 on FIG. 27b.

Figure 27B:
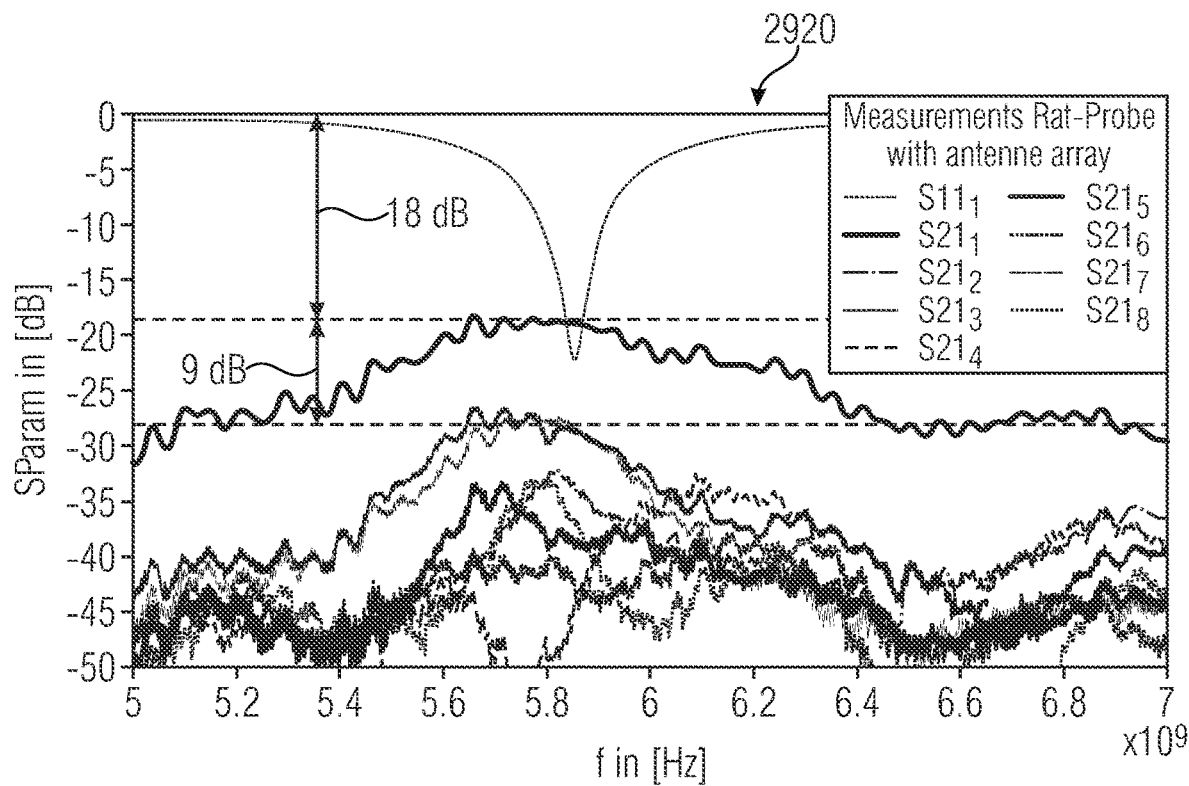
FIG. 27b is a diagram of exemplary results of the experiment depicted in FIG. 27a according to embodiments of the present invention.

The results of the measurement are represented on the diagram 2920 on FIG. 27b. The diagram 2920 displays the measured transmission magnitudes from all eight antenna feeds to the probe connector. The measured coupling from antenna feed to probe is about −18 dB, which includes a few dB of line loss. The measured coupling from the non-probed feed to the probe is about 9 dB smaller for collinear, see number 3, and parallel, see number 7, polarized neighboring patches, and much smaller for all other radiators.

Figure 27C:
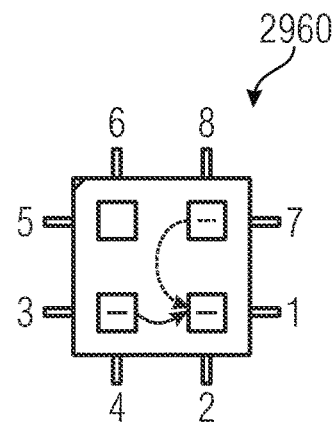
FIG. 27c is a diagram of exemplary port numbering for the tester used to produce the experimental results depicted in FIG. 27b according to embodiments of the present invention.

Port numbering is shown in the inset drawing 2960 on FIG. 27c. For example, |S21$_3$| denotes the transmission from antenna 3 port to the probe, and the probe is mounted on antenna 1 polarization. |S21$_1$| is the probed transmission. The frequency of interest is 5.85 GHz, indicated by the single |S11| curve.

Diagram 2920 shows the measured transmission magnitude from each of the eight antenna connectors to the probe connector using port numbering 2960. The transmission of the probed antenna to the probe is −18 dB, which includes about 1.5 dB of a simulated transmission loss of the probe circuit including balun and combiner. The coupling is relatively strong, and the "unwanted" couplings from the other seven antenna feeds are much smaller, with the collinear and parallel polarized next neighbors coupling strongest at about −27 dB. Simulations indicate that the unwanted coupling reduces by the addition of absorber material. Simulations with all probe lines in place, e.g., with 16 two-wire lines for the four dual-polarized patch antennas, show an increased coupling between the array elements, from about −17 dB in the array without the probes to about −15 dB in the array with all 16 probe lines. No increase of the unwanted coupling levels from the antenna ports to probes on neighboring elements were detected.

Embodiments of the present invention, a tester system for a DUT having an antenna, are thus described. While the present invention has been described in particular embodiments, it should be appreciated that the present invention should not be construed as limited by such embodiments, but rather construed according to the following claims.

What is claimed is:

1. A tester for testing a device under test (DUT), the tester comprising:
    a test fixture configured to receive the DUT, wherein the DUT comprises an antenna array, and wherein the antenna array comprises a plurality of antenna elements; and
    a probe comprising: a first conductor; and a second conductor, and wherein the probe is disposed in close proximity to the test fixture and disposed in a reactive nearfield region of the plurality of antenna elements of the DUT when the DUT is disposed in the test fixture, and wherein the probe is operable to individually test antenna elements of the plurality of antenna elements to test the DUT.

2. The tester for testing a DUT according to claim 1, wherein the probe is further operable to receive a signal transmitted by the antenna array of the DUT.

3. The tester for testing a DUT according to claim 1, wherein the probe is further operable to transmit signals to the DUT that are received by the antenna array of the DUT.

4. The tester for testing a DUT according to claim 1, wherein the first conductor and the second conductor of the probe are substantially parallel.

5. The tester for testing a DUT according to claim 4, wherein the first conductor and the second conductor of the probe act as a transmission line.

6. The tester for testing a DUT according to claim 5, wherein the transmission line comprises a symmetric transmission line at ends of the antenna array.

7. The tester for testing a DUI according to claim 4, wherein the first conductor and the second conductor of the probe are operable to act as a transverse electromagnetic (TEM) transmission line.

8. The tester for testing a DUT according to claim 1, wherein the first conductor and the second conductor of the probe comprise a substantially symmetrical transmission line that transitions to a microstrip line.

9. The tester for testing a DUI according to claim 1, wherein the first conductor and the second conductor of the probe comprise a substantially parallel strip line that transitions to a coax line.

10. A tester system for testing a device under test (DUT), the tester system comprising:

a test fixture configured to receive the DUT, wherein the DUT comprises an antenna array, and wherein the antenna array comprises a plurality of antenna elements;

a probe comprising a first conductor and a second conductor, wherein the probe is disposed in close proximity to the test fixture: and a balun circuit operable to combine currents of the first conductor and the second conductor to convert between a balanced signal and an unbalanced signal to test the DUT.

11. The tester system for testing a DUT according to claim 10, wherein the balun circuit comprises a 180 degrees-hybrid to that transitions to an unbalanced line.

12. The tester system for testing a DUI according to claim 10, wherein the first conductor and the second conductor of the probe are separated by a dielectric spacer.

13. The tester system for testing a DUT according to claim 10, wherein the first conductor and the second conductor of the probe are electrically separated from the antenna array of the DUT.

14. The tester system for testing a DUI according to claim 13, wherein the probe and the antenna array of the DUT are separated by a dielectric spacer.

15. The tester system for testing a DUI according to claim 10, wherein the probe is operable to be disposed in close proximity to a reactive nearfield of the antenna array of the DUT.

16. The tester system for testing a DUT according to claim 15, where a distance between the probe and the antenna array of the DUT is smaller than a distance equal to 10% of a free space wavelength of a signal to be measured.

17. The tester system for testing a DUI according to claim 10, further comprising another probe, wherein the another probe comprises a third conductor and a fourth conductor, wherein the third conductor and the second conductor comprise separate open-ended non-connecting conductors, wherein the antenna array of the DUT comprises a patch antenna, and wherein the third conductor and the fourth conductor are disposed near a radiating edge of the patch antenna of the DUT.

18. An automated test equipment (ATE), comprising:
a tester comprising:
a test fixture configured to receive a DUT for testing; and
a probe; and
a DUT disposed in the test fixture of the tester, wherein the DUT disposed in the test fixture of the tester comprises an antenna array, and wherein the antenna array comprises a plurality of antenna elements, and
wherein the probe is disposed in a reactive near-field of the antenna array and is operable to individually test a respective antenna element of the plurality of antenna elements of the DUT disposed in the test fixture of the tester.

19. The ATE of claim 18, wherein the antenna array of the DUT comprises at least one of: a planar antenna; a patch antenna; a slot antenna; and a dipole antenna, and wherein the antenna array of the DUT is operable to operate at microwave frequencies or millimeter-wave frequencies.

* * * * *